US012651616B2

(12) United States Patent (10) Patent No.: US 12,651,616 B2
Lu et al. (45) Date of Patent: Jun. 9, 2026

(54) SHARABLE USAGE-BASED DISTURBANCE CIRCUITRY

(71) Applicant: Micron Technology, Inc., Boise, ID (US)

(72) Inventors: Yang Lu, Boise, ID (US); Yuan He, Boise, ID (US); Kang-Yong Kim, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 198 days.

(21) Appl. No.: 18/520,189

(22) Filed: Nov. 27, 2023

(65) Prior Publication Data

US 2024/0177745 A1 May 30, 2024

Related U.S. Application Data

(60) Provisional application No. 63/385,515, filed on Nov. 30, 2022.

(51) Int. Cl.
*G11C 8/12* (2006.01)
*G11C 7/08* (2006.01)
*G11C 7/10* (2006.01)
*G11C 29/52* (2006.01)

(52) U.S. Cl.
CPC .............. *G11C 7/08* (2013.01); *G11C 7/1069* (2013.01); *G11C 29/52* (2013.01)

(58) Field of Classification Search
CPC .......... G11C 7/08; G11C 7/1069; G11C 29/52
See application file for complete search history.

(56) References Cited

U.S. PATENT DOCUMENTS

| | | | | |
|---|---|---|---|---|
| 10,671,478 B2 * | 6/2020 | Cha | ........................ | G06F 11/106 |
| 2013/0275830 A1 * | 10/2013 | Park | ........................ | G11C 29/52 |
| | | | | 714/758 |
| 2021/0200630 A1 * | 7/2021 | Ishikawa | ............. | G11C 11/4085 |

* cited by examiner

*Primary Examiner* — Min Huang
(74) *Attorney, Agent, or Firm* — Colby Nipper PLLC

(57) ABSTRACT

Apparatuses and techniques for implementing shareable usage-based disturbance circuitry are described. Shareable usage-based disturbance circuitry includes circuits (e.g., shared circuits) that manage usage-based disturbance across at least two sections of a bank of memory within a die of a memory device. In example implementations, the shareable usage-based disturbance circuitry includes a counter circuit and/or an error-correction-code circuit that is coupled to sense amplifiers associated with two neighboring sections. With the shareable usage-based disturbance circuitry, dies within the memory device can be cheaper to manufacture, can consume less power, and can have a smaller footprint with less complex signal routing compared to other dies with other circuits dedicated to mitigating usage-based disturbance within each section.

20 Claims, 12 Drawing Sheets

100

Apparatus
102

Host Device
104

Processor
110

↕

Cache Memory
112

↕

Memory Controller
114

116 — ⇕ — Interconnect 106

Memory Device
108

Memory Array
118

Sections
122-1 to 122-N

Usage-Based Disturbance (UBD) Circuitry
120

Shared Circuit
124-1 to 124-M

IoT ↔ — 102-1

— 102-2

— 102-3

— 102-4

— 102-5

— 102-6

— 102-7

Y Axis
602-2

X Axis
602-1

800

Die
304

Group
802-1

Group
802-2

Group
802-X

Group
802-(X+1)

Group
802-Y

Group
802-Z

Bank
402-1

UBD
Circuitry
120

Bank
402-2

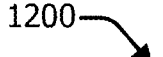

1200

Dispose, on a die, a bank comprising two sections positioned along an axis, the two sections having a total length defined in a direction that is parallel to the axis
1202

Dispose, on the die, a circuit having a length defined in a direction that is parallel to the axis, the length being less than or equal to the total length, the circuit being positioned proximate to the two sections in a direction that is perpendicular to the axis
1204

FIG. 12

SHARABLE USAGE-BASED DISTURBANCE CIRCUITRY

CROSS-REFERENCE TO RELATED APPLICATION

This application claims priority to U.S. Provisional Patent Application Ser. No. 63/385,515 filed on Nov. 30, 2022, the disclosure of which is incorporated by reference herein in its entirety.

BACKGROUND

Computers, smartphones, and other electronic devices rely on processor and memories. A processor executes code based on data to run applications and provide feature to a user. The processor obtains the code and the data from a memory. The memory in an electronic device can include volatile memory (e.g., random-access memory (RAM)) and nonvolatile memory (e.g., flash memory). Like the capabilities of a processor, the capabilities of a memory can impact the performance of an electronic device. This performance impact can increase as processor are developed that execute code faster and as applications operate on increasingly larger data sets that require ever-larger memories.

BRIEF DESCRIPTION OF THE DRAWINGS

Apparatuses of and techniques for implementing sharable usage-based disturbance circuitry are described with reference to the following drawings. The same numbers are used throughout the drawings to reference like features and components:

FIG. 12 illustrates an example method for implementing aspects of sharable usage-based disturbance circuitry.

DETAILED DESCRIPTION

Overview

Figure 1:
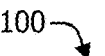
FIG. 1 illustrates example apparatuses that can implement aspects of sharable usage-based disturbance circuitry.

Processors and memory work in tandem to provide features to users of computers and other electronic devices. Generally, an electronic device can provide enhanced features, such as high-resolution graphics or artificial intelligence, as a processor and memory operate more quickly together in a complementary manner. Some applications, like those for artificial intelligence (AI) analysis and virtual-reality graphics, can also demand increasing amounts of memory. Such applications use increasing amounts of memory to more accurately model and mimic human thinking and the physical world.

Processors and memories can be secured to a printed circuit board (PCB), such as a rigid or flexible motherboard. The printed circuit board can include sockets for accepting at least one processor and one or more memories. Wiring infrastructure that enables communication between two or more components can also be disposed on at least one layer of the printed circuit board. This printed circuit board, however, provides a finite area for the sockets and the wiring infrastructure. Some printed circuit boards include multiple sockets that are each shaped as a linear slot and designed to accept a double-inline memory module (DIMM). These sockets can be fully occupied by double-inline memory modules while a processor is still able to utilize more memory. In such situations, the system is capable of performing better if additional memory were available to the processor.

Printed circuit boards may also include at least one peripheral component interconnect (PCI) express (PCI Express®) (PCIe or PCI-E) slot. A PCIe slot is designed to provide a common interface for various types of components that may be coupled to a printed circuit board. Compared to some older standards, PCIe can provide higher rates of data transfer or a smaller footprint on the printed circuit board, including both greater speed and smaller size. Accordingly, certain printed circuit boards enable a processor to access a memory device that is connected to the printed circuit board via a PCIe slot.

In some cases, accessing a memory solely using a PCIe protocol may not offer as much functionality, flexibility, or reliability as is desired. In such cases, another protocol may be layered on top of the PCIe protocol. An example of another, higher-level protocol is the Compute Express Link™ (CXL) protocol. The CXL protocol can be implemented over a physical layer that is governed by the PCIe protocol. The CXL protocol can provide a memory-coherent interface that offers high-bandwidth or low-latency data transfers, including data transfers having both higher bandwidth and lower latency.

Various electronic devices, such as a mobile phone having a processor that is part of a system-on-chip (SoC) or a cloud-computing server having dozens of discrete processing units, may employ memory that is coupled to a processor via a CXL-based interconnect. For clarity, consider an apparatus with a host device that is coupled to a memory device via a CXL-based interconnect. The host device can include a processor and a controller (e.g., a host-side controller) that is coupled to the interconnect. The memory device can include another controller (e.g., a memory-side controller) that is coupled to the interconnect and one or more memory arrays to store information in SRAM, DRAM, flash memory, and so forth.

To meet the demands for physically smaller memories, memory devices can be designed with higher chip densities. Increasing chip density, however, can increase the electromagnetic coupling (e.g., capacitive coupling) between adjacent or proximate rows of memory cells due, at least in part, to a shrinking distance between these rows. With this undesired coupling, activation (or charging) of a first row of memory cells can sometimes negatively impact a second nearby row of memory cells. In particular, activation of the first row can generate interference, or crosstalk, that causes the second row to experience a voltage fluctuation. In some instances, this voltage fluctuation can cause a state (or value) of a memory cell in the second row to be incorrectly determined by a sense amplifier. Consider an example in which a state of a memory cell in the second row is a "1". In this example, the voltage fluctuation can cause a sense amplifier to incorrectly determine the state of the memory cell to be a "0" instead of a "1". Left uncheck, this interference can lead to memory errors or data loss within the memory device.

In some circumstances, a particular row of memory cells is activated repeatedly in an unintentional or intentional (sometimes malicious) manner. Consider, for instance, that memory cells in an $R^{th}$ row are subjected to repeated activation, which causes one or more memory cells in an adjacent row (e.g., within an R+1 row, an R+2 row, an R−1 row, and/or an R-2 row) to change states. This effect is referred to as a usage-based disturbance. The occurrence of usage-based disturbance can lead to the corruption or changing of contents within the affected row of memory.

Some memory devices utilize circuits that can detect usage-based disturbance and mitigate its effects. These circuits, however, can add complexity and cost to a memory device. Additionally, these circuits can increase an overall footprint and power consumption of the memory device, which can make it challenging to integrate within space-constrained devices, including portable devices.

To address this and other issues regarding usage-based disturbance, this document describes aspects of sharable usage-based disturbance circuitry. Shareable usage-based disturbance circuitry includes circuits (e.g., shared circuits) that manage usage-based disturbance across at least two sections of a bank of memory within a die of a memory device. In example implementations, the shareable usage-based disturbance circuitry includes a counter circuit and/or an error-correction-code circuit that is coupled to sense amplifiers associated with two neighboring sections. By using the same circuit to mitigate usage-based disturbance within multiple sections, a footprint of the shareable usage-based disturbance circuitry can be redesigned to enable the die to have a smaller footprint along an axis that is parallel to rows of memory cells within the sections. Consequently, the memory device can be less expensive to manufacture compared to other memory devices with other circuits dedicated for each section. In addition to this compact and cost-saving layout, use of the shareable usage-based disturbance circuitry can reduce power consumption and simplify signal routing within the memory device compared to other memory devices with other circuits dedicated to mitigating usage-based disturbance within each section.

Example Operating Environments

FIG. 1 illustrates, at 100 generally, an example operating environment including an apparatus 102 that can implement sharable usage-based disturbance circuitry. The apparatus 102 can include various types of electronic devices, including an internet-of-things (IOT) device 102-1, tablet device 102-2, smartphone 102-3, notebook computer 102-4, passenger vehicle 102-5, server computer 102-6, and server cluster 102-7 that may be part of cloud computing infrastructure, a data center, or a portion thereof (e.g., a printed circuit board (PCB)). Other examples of the apparatus 102 include a wearable device (e.g., a smartwatch or intelligent glasses), entertainment device (e.g., a set-top box, video dongle, smart television, a gaming device), desktop computer, motherboard, server blade, consumer appliance, vehicle, drone, industrial equipment, security device, sensor, or the electronic components thereof. Each type of apparatus can include one or more components to provide computing functionalities or features.

In example implementations, the apparatus 102 can include at least one host device 104, at least one interconnect 106, and at least one memory device 108. The host device 104 can include at least one processor 110, at least one cache memory 112, and a memory controller 114. The memory device 108, which can also be realized with a memory module, can include, for example, a dynamic random-access memory (DRAM) die or module (e.g., Low-Power Double Data Rate synchronous DRAM (LPDDR SDRAM)). The DRAM die or module can include a three-dimensional (3D) stacked DRAM device, which may be a high-bandwidth memory (HBM) device or a hybrid memory cube (HMC) device. The memory device 108 can operate as a main memory for the apparatus 102. Although not illustrated, the apparatus 102 can also include storage memory. The storage memory can include, for example, a storage-class memory device (e.g., a flash memory, hard disk drive, solid-state drive, phase-change memory (PCM), or memory employing 3D XPoint™).

The processor 110 is operatively coupled to the cache memory 112, which is operatively coupled to the memory controller 114. The processor 110 is also coupled, directly or indirectly, to the memory controller 114. The host device 104 may include other components to form, for instance, a system-on-a-chip (SoC). The processor 110 may include a general-purpose processor, central processing unit, graphics processing unit (GPU), neural network engine or accelerator, application-specific integrated circuit (ASIC), field-programmable gate array (FPGA) integrated circuit (IC), or communications processor (e.g., a modem or baseband processor).

In operation, the memory controller 114 can provide a high-level or logical interface between the processor 110 and at least one memory (e.g., an external memory). The memory controller 114 may be realized with any of a variety of suitable memory controllers (e.g., a double-data-rate (DDR) memory controller that can process requests for data stored on the memory device 108). Although not shown, the host device 104 may include a physical interface (PHY) that transfers data between the memory controller 114 and the memory device 108 through the interconnect 106. For example, the physical interface may be an interface that is compatible with a DDR PHY Interface (DFI) Group interface protocol. The memory controller 114 can, for example, receive memory requests from the processor 110 and provide the memory requests to external memory with appropriate formatting, timing, and reordering. The memory controller 114 can also forward to the processor 110 responses to the memory requests received from external memory.

The host device 104 is operatively coupled, via the interconnect 106, to the memory device 108. In some examples, the memory device 108 is connected to the host device 104 via the interconnect 106 with an intervening buffer or cache. The memory device 108 may operatively couple to storage memory (not shown). The host device 104 can also be coupled, directly or indirectly via the interconnect 106, to the memory device 108 and the storage memory. The interconnect 106 and other interconnects (not illustrated in FIG. 1) can transfer data between two or more components of the apparatus 102. Examples of the interconnect 106 include a bus (e.g., a unidirectional or bidirectional bus), switching fabric, or one or more wires that carry voltage or current signals. The interconnect 106 can propagate one or more communications 116 between the host device 104 and the memory device 108. For example, the host device 104 may transmit a memory request to the memory device 108 over the interconnect 106. Also, the memory device 108 may transmit a corresponding memory response to the host device 104 over the interconnect 106.

In other implementations, the interconnect 106 can be realized as a CXL link. In other words, the interconnect 106 can comport with at least one CXL standard or protocol. The CXL link can provide an interface on top of the physical layer and electricals of a PCIe 5.0 physical layer. The CXL link can cause requests to and responses from the memory device 108 to be packaged as flits. An example implementation of the apparatus 102 with a CXL link is discussed in greater detail with respect to FIG. 4. In still other implementations, the interconnect 106 can be another type of link, including a PCIe 5.0 link. In this document, some terminology may draw from one or more of these standards or versions thereof, like the CXL standard, for clarity. The described principles, however, are also applicable to memories and systems that comport with other standards and types of interconnects.

The illustrated components of the apparatus 102 represent an example architecture with a hierarchical memory system. A hierarchical memory system may include memories at different levels, with each level having memory with a different speed or capacity. As illustrated, the cache memory 112 logically couples the processor 110 to the memory device 108. In the illustrated implementation, the cache memory 112 is at a higher level than the memory device 108. A storage memory, in turn, can be at a lower level than the main memory (e.g., the memory device 108). Memory at lower hierarchical levels may have a decreased speed but increased capacity relative to memory at higher hierarchical levels.

The apparatus 102 can be implemented in various manners with more, fewer, or different components. For example, the host device 104 may include multiple cache memories (e.g., including multiple levels of cache memory) or no cache memory. In other implementations, the host device 104 may omit the processor 110 or the memory controller 114. A memory (e.g., the memory device 108) may have an "internal" or "local" cache memory. As another example, the apparatus 102 may include cache memory between the interconnect 106 and the memory device 108. Computer engineers can also include any of the illustrated components in distributed or shared memory systems.

Computer engineers may implement the host device 104 and the various memories in multiple manners. In some cases, the host device 104 and the memory device 108 can be disposed on, or physically supported by, a printed circuit board (e.g., a rigid or flexible motherboard). The host device 104 and the memory device 108 may additionally be integrated together on an integrated circuit or fabricated on separate integrated circuits and packaged together. The memory device 108 may also be coupled to multiple host devices 104 via one or more interconnects 106 and may respond to memory requests from two or more host devices 104. Each host device 104 may include a respective memory controller 114, or the multiple host devices 104 may share a memory controller 114. This document describes with reference to FIG. 1 an example computing system architecture having at least one host device 104 coupled to a memory device 108.

Two or more memory components (e.g., modules, dies, banks, or bank groups) can share the electrical paths or couplings of the interconnect 106. The interconnect 106 can include at least one command-and-address bus (CA bus) and at least one data bus (DQ bus). The command-and-address bus can transmit addresses and commands from the memory controller 114 of the host device 104 to the memory device 108, which may exclude propagation of data. The data bus can propagate data between the memory controller 114 and the memory device 108. The memory device 108 may also be implemented as any suitable memory including, but not limited to DRAM. SDRAM, three-dimensional (3D) stacked DRAM. DDR memory, or LPDDR memory (e.g., LPDDR DRAM or LPDDR SDRAM).

The memory device 108 can form at least part of the main memory of the apparatus 102. The memory device 108 may, however, form at least part of a cache memory, a storage memory, or a system-on-chip of the apparatus 102. The memory device 108 includes at least one memory array 118 and usage-based disturbance (UBD) circuitry 120 (e.g., shareable usage-based disturbance circuitry).

The memory array 118 can include an array of memory cells, including but not limited to memory cells of DRAM, SDRAM, 3D-stacked DRAM, DDR memory, low-power DRAM, or LPDDR SDRAM. For example, the memory array 118 can include memory cells of SDRAM configured as a memory module with one channel containing either 16 or 8 data (DQ) signals, double-data-rate input/output (I/O) signaling, and supporting a supply voltage of 0.3 to 0.5V. The density of the memory device 108 can range, for instance, from 2 Gb to 32 Gb.

The memory array 118 includes sections 122-1 to 122-N, where N represents a positive integer. Each section 122 includes at least one subarray, which is further described with respect to FIG. 5. Memory cells within each section 122 can be subjected to usage-based disturbance. This includes usage-based disturbance generated by the unintentional or intentional repeated activation of rows within the section 122.

The usage-based disturbance circuitry 120 mitigates usage-based disturbance within the memory array 118. In one aspect, the usage-based disturbance circuitry 120 can monitor (e.g., track or detect) conditions associated with usage-based disturbance within each section 122. For example, the usage-based disturbance circuitry 120 can determine how many times and/or how often one or more rows within a section 122 are activated. In some instances, the usage-based disturbance circuitry 120 can cause one or more rows within the section 122 to be refreshed based on an activation count of another row exceeding a threshold. In another aspect, the usage-based disturbance circuitry 120 can detect and/or correct bit errors, which may have been caused by usage-based disturbance.

In the depicted configuration, the usage-based disturbance circuitry 120 includes shared circuits 124-1 to 124-M, where M represents a positive integer that is less than N. Each shared circuit 124 mitigates usage-based disturbance for at least two sections 122-1 to 122-N. For example, a shared circuit 124 can monitor and/or correct for usage-based disturbance for two neighboring sections 122 (e.g., sections that are proximate to each other), as further described with respect to FIGS. 9 to 11. In example implementations, a shared circuit 124 includes at least one counter circuit and/or at least one error-correction-code circuit, as further described with respect to FIG. 4. By having each shared circuit 124 manage usage-based disturbance for multiple sections 122, the memory device 108 can be cheaper to manufacture, can consume less power, and can have a smaller footprint with less complex signal routing compared to other memory devices with circuits dedicated to managing usage-based disturbance for each section. The usage-based disturbance circuitry 120 is further described with respect to FIG. 2.

Figure 2:
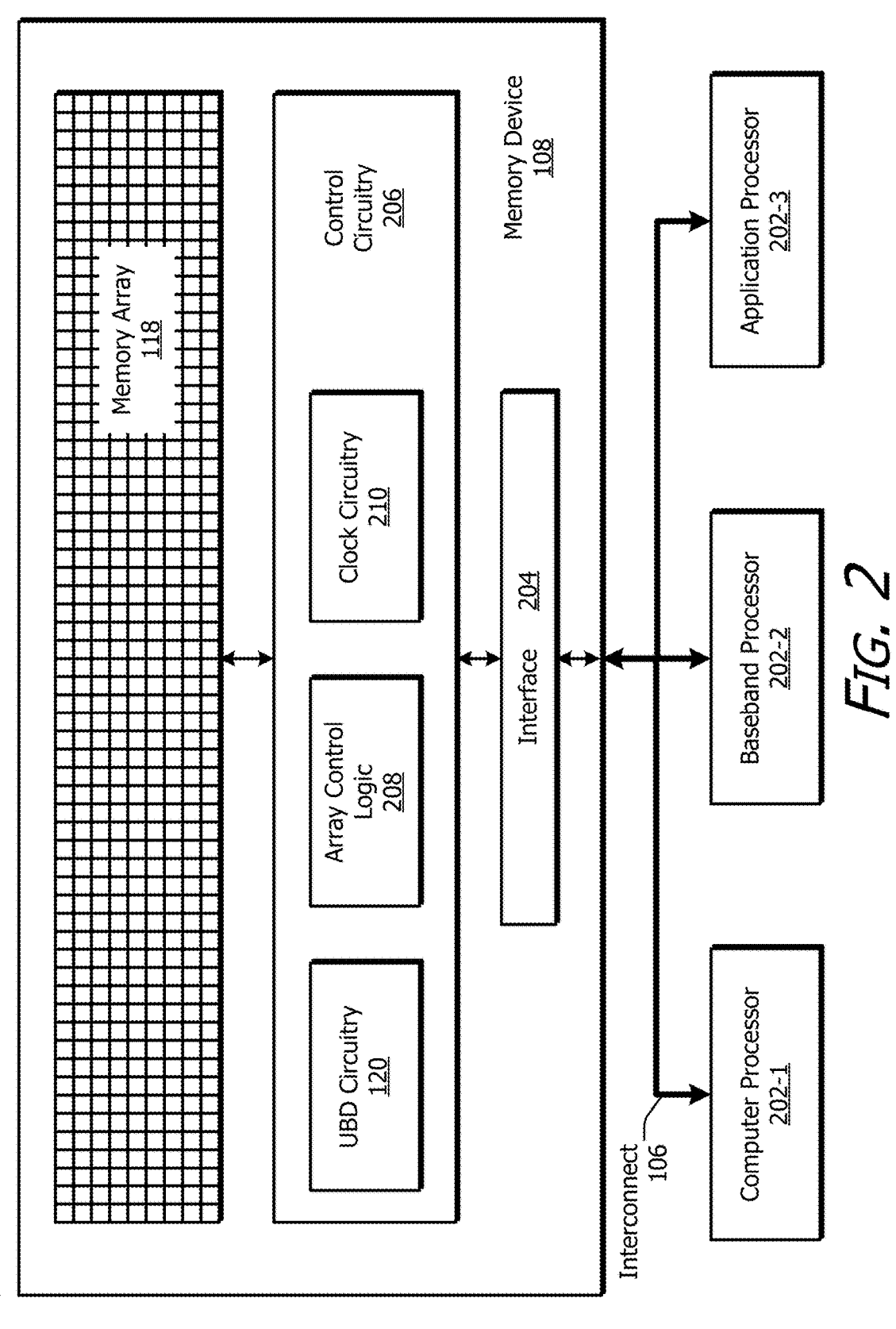
FIG. 2 illustrates an example computing system that can implement aspects of sharable usage-based disturbance circuitry within a memory device.

FIG. 2 illustrates an example computing system 200 that can implement aspects of sharable usage-based disturbance circuitry. In some implementations, the computing system 200 includes at least one memory device 108, at least one interconnect 106, and at least one processor 202. The memory device 108 can include, or be associated with, at least one memory array 118, at least one interface 204, and control circuitry 206 (or periphery circuitry) operatively coupled to the memory array 118. The memory array 118 and the control circuitry 206 may be components on a single semiconductor die or on separate semiconductor dies. The memory array 118 or the control circuitry 206 may also be distributed across multiple dies. This control circuitry 206 may manage traffic on a bus that is separate from the interconnect 106.

The control circuitry 206 can include various components that the memory device 108 can use to perform various operations. These operations can include communicating with other devices, managing memory performance, performing refresh operations (e.g., self-refresh operations or auto-refresh operations), and performing memory read or write operations. For example, the control circuitry 206 can include at least one instance of array control logic 208 and clock circuitry 210. The array control logic 208 can include circuitry that provides command decoding, address decoding, input/output functions, amplification circuitry, power supply management, power control modes, and other functions. The clock circuitry 210 can synchronize various memory components with one or more external clock signals provided over the interconnect 106, including a command-and-address clock or a data clock. The clock circuitry 210 can also use an internal clock signal to synchronize memory components and may provide timer functionality.

The control circuitry 206 also includes the usage-based disturbance circuitry 120 (UBD circuitry 120), as shown in FIG. 2. In general, the usage-based disturbance circuitry 120 is coupled to the memory array 118 and monitors the conditions associated with usage-based disturbance. The usage-based disturbance circuitry 120 can also be coupled to other components within the control circuitry 206 to cause the control circuitry 206 to perform refresh operations or correct bit errors.

The interface 204 can couple the control circuitry 206 or the memory array 118 directly or indirectly to the interconnect 106. In some implementations, the usage-based disturbance circuitry 120, the array control logic 208, and the clock circuitry 210 can be part of a single component (e.g., the control circuitry 206). In other implementations, one or more of the usage-based disturbance circuitry 120, the array control logic 208, or the clock circuitry 210 may be implemented as separate components, which can be provided on a single semiconductor die or disposed across multiple semiconductor dies. These components may individually or jointly couple to the interconnect 106 via the interface 204.

The interconnect 106 may use one or more of a variety of interconnects that communicatively couple together various components and enable commands, addresses, or other information and data to be transferred between two or more components (e.g., between the memory device 108 and the processor 202). Although the interconnect 106 is illustrated with a single line in FIG. 2, the interconnect 106 may include at least one bus, at least one switching fabric, one or more wires or traces that carry voltage or current signals, at least one switch, one or more buffers, and so forth. Further, the interconnect 106 may be separated into at least a command-and-address bus and a data bus. As discussed above with respect to FIG. 1, the interconnect 106 can include a CXL link or comport with at least one CXL standard. The CXL link can provide an interface or overlay on top of the physical layer and electricals of the PCIe 5.0 physical layer.

In some aspects, the memory device 108 may be a "separate" component relative to the host device 104 (of FIG. 1) or any of the processors 202. The separate components can include a printed circuit board, memory card, memory stick, and memory module (e.g., a single in-line memory module (SIMM) or dual in-line memory module (DIMM)). Thus, separate physical components may be located together within the same housing of an electronic device or may be distributed over a server rack, a data center, and so forth. Alternatively, the memory device 108 may be integrated with other physical components, including the host device 104 or the processor 202, by being combined on a printed circuit board or in a single package or a system-on-chip.

As shown in FIG. 2, the processors 202 may include a computer processor 202-1, a baseband processor 202-2, and an application processor 202-3, coupled to the memory device 108 through the interconnect 106. The processors 202 may include or form a part of a central processing unit, graphics processing unit, system-on-chip, application-specific integrated circuit, or field-programmable gate array. In some cases, a single processor can comprise multiple processing resources, each dedicated to different functions (e.g., modem management, applications, graphics, central processing). In some implementations, the baseband processor 202-2 may include or be coupled to a modem (not illustrated in FIG. 2) and referred to as a modem processor. The modem or the baseband processor 202-2 may be coupled wirelessly to a network via, for example, cellular, Wi-Fi®, Bluetooth®, near field, or another technology or protocol for wireless communication.

In some implementations, the processors 202 may be connected directly to the memory device 108 (e.g., via the interconnect 106). In other implementations, one or more of the processors 202 may be indirectly connected to the memory device 108 (e.g., over a network connection or through one or more other devices). Further, the processor 202 may be realized as one that can communicate over a CXL-compatible interconnect. Accordingly, a respective processor 202 can include or be associated with a respective link controller, like the link controller 702 illustrated in FIG. 7. Alternatively, two or more processors 202 may access the memory device 108 using a shared link controller 702. In some of such cases, the memory device 108 may be implemented as a CXL-compatible memory device (e.g., as a CXL Type 3 memory expander) or another memory device that is compatible with a CXL protocol may also or instead be coupled to the interconnect 106.

Example Techniques and Hardware

Figure 3:
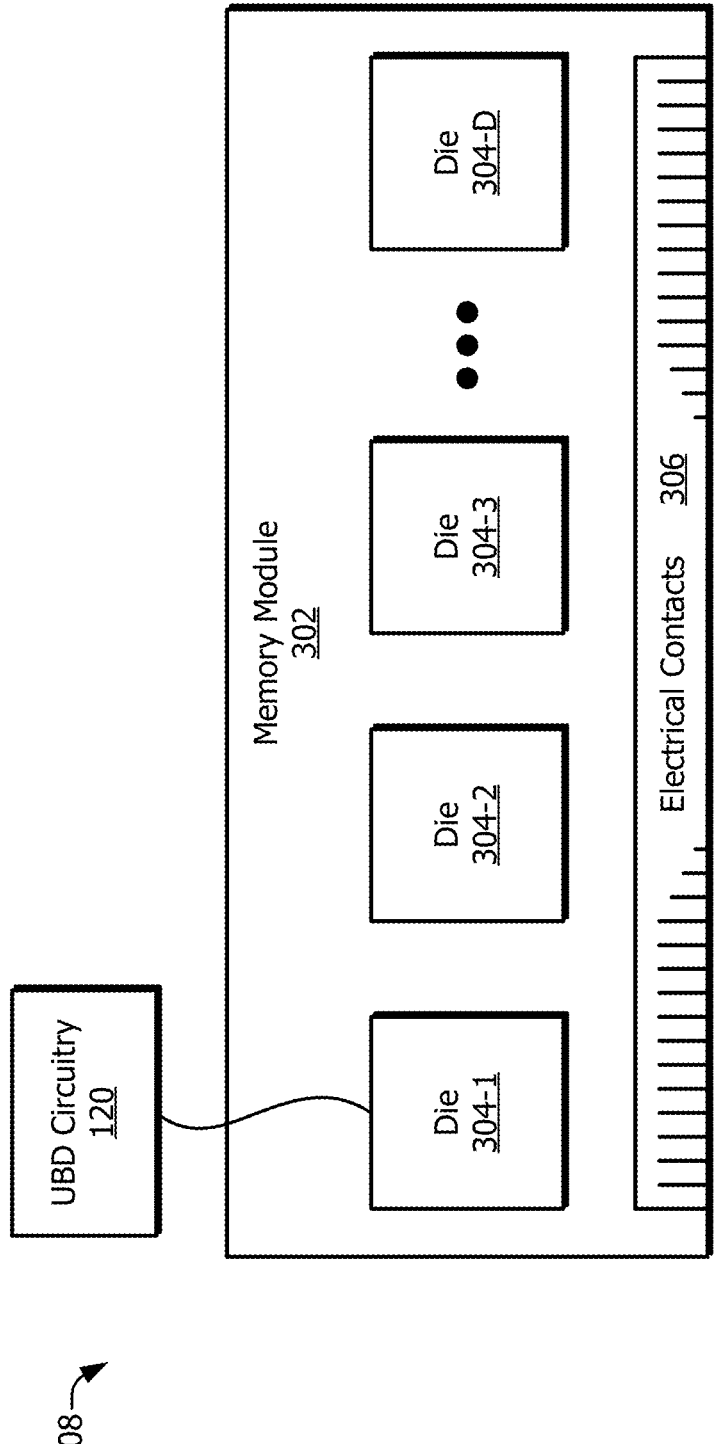
FIG. 3 illustrates an example memory device in which aspects of sharable usage-based disturbance circuitry may be implemented.

FIG. 3 illustrates an example memory device 108 in which aspects of shareable usage-based disturbance circuitry can be implemented. The memory device 108 includes a memory module 302, which can include multiple dies 304. As illustrated, the memory module 302 includes a first die 304-1, a second die 304-2, a third die 304-3, and a Dth die 304-D, with D) representing a positive integer. One or more of the dies 304-1 to 304-D can include usage-based disturbance circuitry 120.

As a few examples, the memory module 302 can be a SIMM or a DIMM. As another example, the memory module 302 can interface with other components via a bus interconnect (e.g., a Peripheral Component Interconnect Express (PCIe®) bus). The memory device 108 illustrated in FIGS. 1 and 2 can correspond, for example, to multiple dies (or dice) 304-1 through 304-D, or a memory module 302 with two or more dies 304. As shown, the memory module 302 can include one or more electrical contacts 306 (e.g., pins) to interface the memory module 302 to other components.

The memory module 302 can be implemented in various manners. For example, the memory module 302 may include a printed circuit board, and the multiple dies 304-1 through 304-D may be mounted or otherwise attached to the printed circuit board. The dies 304 (e.g., memory dies) may be arranged in a line or along two or more dimensions (e.g., forming a grid or array). The dies 304 may have a similar size or may have different sizes. Each die 304 may be similar to another die 304 or different in size, shape, data capacity, or control circuitries. The dies 304 may also be positioned on a single side or on multiple sides of the memory module 302. In some cases, the memory module 302 may be part of a CXL memory system or module. Example components of the dies 304-1 to 304-D are further described with respect to FIG. 4.

Figure 4:
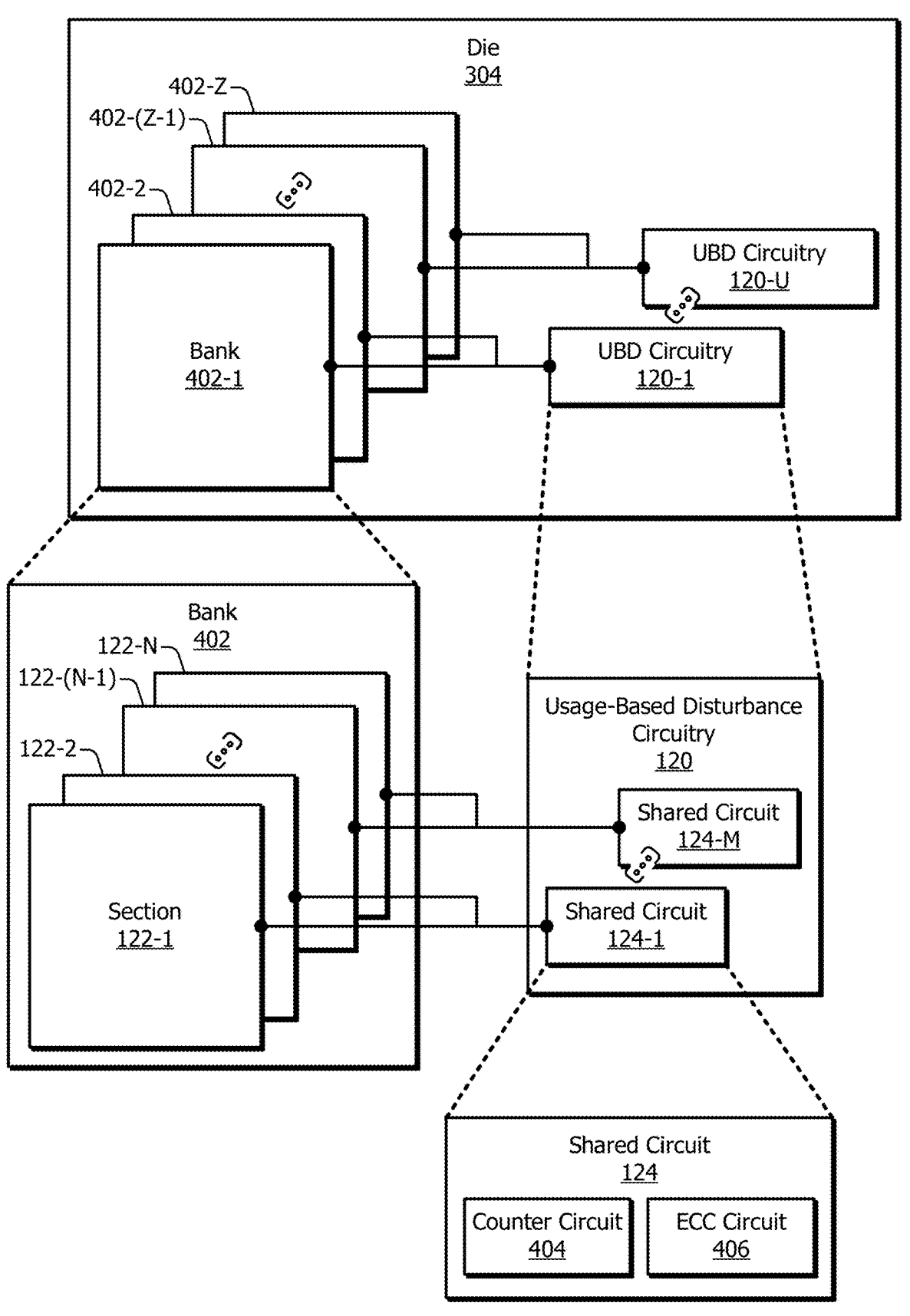
FIG. 4 illustrates an example die in which aspects of shareable usage-based disturbance circuitry may be implemented.

FIG. 4 illustrates an example die 304 in which aspects of shareable usage-based disturbance circuitry can be implemented. The die 304 in FIG. 4 can represent any of the dies 304-1 to 304-D in FIG. 3. In the depicted configuration, the die 304 includes multiple banks 402, including banks 402-1, 402-2 . . . 402-(Z−1), and 402-Z, with Z representing a positive integer. The die 304 also includes usage-based disturbance circuitry 120-1 to 120-U, with U representing a positive integer. In this example implementation, each instance of usage-based disturbance circuitry 120-1 to 120-U is coupled to multiple banks 402-1 to 402-Z. For example, the usage-based disturbance circuitry 120-1 is coupled to the banks 402-1 and 402-2. Also, the usage-based disturbance circuitry 120-U is coupled to the banks 402-(Z−1) and 402-Z. In this case, the die 304 includes a larger quantity of banks 402 relative to instances of usage-based disturbance circuitry 120 (e.g., Z is greater than (J). In an example implementation, the die 304 includes twice as many banks 402 as instances of usage-based disturbance circuitry 120 (e.g., Z is equal to 2U).

Although FIG. 4 shows each instance of usage-based disturbance circuitry 120 coupled to two banks 402, other implementations are also possible. For example, one or more of the usage-based disturbance circuitry 120-1 to 120-U can be coupled to fewer banks 402 (e.g., a single bank 402) or more than two banks 402 (e.g., three or four banks 402).

Each bank 402 includes at least two sections 122. In FIG. 4, the bank 402 is shown to include sections 122-1, 122-2 . . . 122-(N−1), and 122-N. Each section 122 includes rows of memory cells, which are further described with respect to FIG. 6. Although not explicitly shown, the bank 402 can include other components, such as row decoders and column decoders.

Each instance of usage-based disturbance circuitry 120 includes multiple shared circuits 124-1 to 124-M. Each shared circuit 124 is coupled to at least two of the sections 122 within the bank 402. For example, the shared circuit 124-1 is coupled to the sections 122-1 and 122-2. Similarly, the shared circuit 124-M is coupled to the sections 122-(N−1) and 122-N. The sections 122 that the shared circuit 124 is coupled to can be neighboring sections, as further described with respect to FIGS. 9 and 11. With this coupling, each shared circuit 124 can manage usage-based disturbance within at least two sections 122 of the bank 402. In one aspect, this coupling enables each of the shared circuits 124 to read (or accept) data that is stored in multiple sections 122. This data is further described with respect to FIG. 5.

As shown in FIG. 4, the bank 402 includes a larger quantity of sections 122 relative to a quantity of shared circuits 124 within an instance of the usage-based disturbance circuitry 120 (e.g., N is greater than M). In an example implementation, there are twice as many sections 122 in a bank 402 as shared circuits 124 in an instance of usage-based disturbance circuitry 120 (e.g., N is equal to 2M).

Each shared circuit 124 can include at least one counter circuit 404 and/or at least one error-correction-code (ECC) circuit 406. In example implementations, each shared circuit 124 includes a counter circuit 404 and an error-correction-code circuit 406. Other implementations of the shared circuit 124 that include other types of components are also possible. The counter circuit 404 can include at least one flip-flop circuit and/or at least one comparator. To mitigate usage-based disturbance, the counter circuit 404 can initiate refresh operations based on a comparison of a row-based activation count to a threshold.

The error-correction-code circuit 406 can be realized as hardware (e.g., logic) that implements an error-correction-code algorithm or other mechanisms for detection and/or correction of single-bit or multi-bit errors (e.g., 1-bit, 2-bit, or 3-bit errors). This hardware can include, for instance, at least one field-programmable gate array (FPGA) or at least one complex programmable logic device (CPLD). The error-correction-code circuit 406 may implement block codes, such as Hamming codes, Hsiao codes, or Bose-Chaudhuri-Hocquenghm (BCH) codes. The code can provide single error correction (SEC), double error correction (DEC), double error detection (DED), triple error detection (TED), single byte error detection (SBD), double byte error detection (DBD), or combinations thereof. Other error-correction-code algorithms and mechanisms are also possible. Example components of the sections 122-1 to 122-N are further described with respect to FIG. 5.

Figure 5:
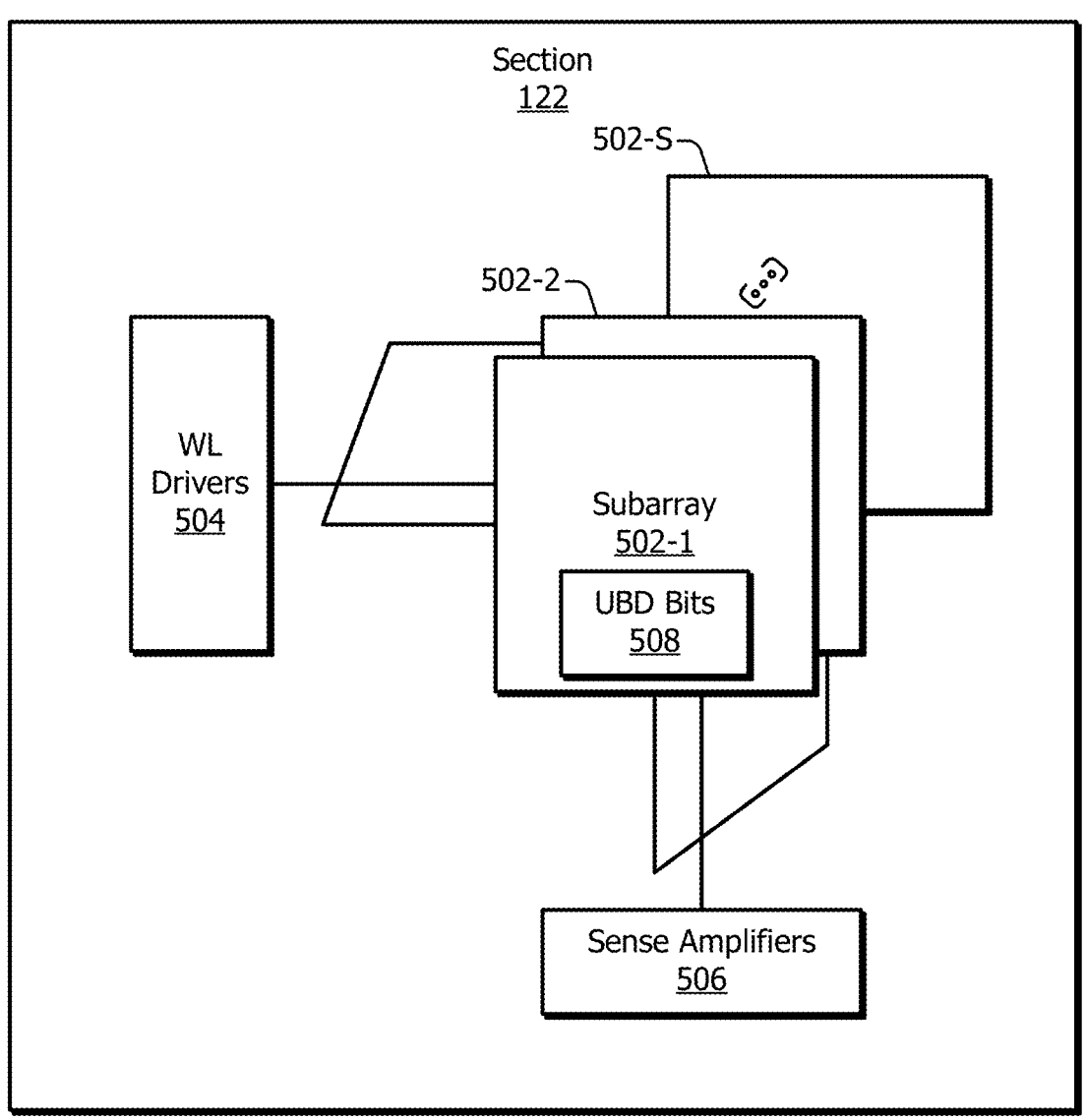
FIG. 5 illustrates an example section of a memory device that implements aspects of shareable usage-based disturbance circuitry.

FIG. 5 illustrates an example section 122 that can be coupled to shareable usage-based disturbance circuitry. The section 122 in FIG. 5 can represent any of the sections 122-1 to 122-N shown in FIG. 4. In the depicted configuration, the section 122 includes subarrays 502-1, 502-2 . . . 502-S, wordline drivers 504, and sense amplifiers 506. Each subarray 502 is coupled to at least a portion of the wordline drivers 504 and at least a portion of the sense amplifiers 506. Some of the wordline drivers 504 can be coupled to multiple subarrays 502 within a same section 122 (e.g., two of the subarrays 502-1 to 502-S within the section 122). Some of the sense amplifiers 506 can be coupled to multiple subarrays 502 associated with different sections 122 (e.g., a subarray 502 from section 122-1 and another subarray 502 from section 122-2). A physical arrangement of the subarrays 502, the wordline drivers 504, and the sense amplifiers 506 is further described with respect to FIG. 9.

At least a portion of at least one of the subarrays 502-1 to 502-S of a section 122 can store bits associated with usage-based disturbance. These bits are referred to as usage-based disturbance bits 508 (UBD bits 508). Examples of usage-based disturbance bits 508 can include bits utilized by the counter circuit 404 and/or the error-correction-code circuit 406. The bits utilized by the counter circuit 404 can include bits that represent a quantity of activations (e.g., an activation count or activate count) for one or more rows within the section 122 since a last refresh. The bits utilized by the counter circuit 404 can also include or represent a row address associated with each count. The bits utilized by the error-correction-code circuit 406 can include parity bits, which form part of a code word.

A wordline driver 504 can activate a particular row within the subarray 502 for read and/or write operations. At least a portion of the sense amplifiers 506 are coupled to a shared circuit 124, as further described with respect to FIGS. 9 and 10. Although not explicitly shown, the section 122 can include additional circuitry to store data that is read using the sense amplifiers 506 (e.g., hold data while the sense amplifiers 506 are pre-charged for another read operation).

During operation, the shared circuit 124 can read and/or write usage-based disturbance bits 508 via the sense amplifiers 506. For example, the counter circuit 404 can update a count associated with activation of a row within the subarray 502 and determine whether or not an extra refresh is to be performed to mitigate usage-based disturbance. Additionally or alternatively, the error-correction-code circuit 406 can detect and/or correct bit errors within a row of the subarray 502 to mitigate usage-based disturbance.

In some implementations, a subset of the sense amplifiers 506 can be used to read usage-based disturbance bits 508 within different sections 122. Consider a simplified example in which the subarray 502-1 of the section 122-1 stores sixteen usage-based disturbance bits 508 and the subarray 502-1 of the section 122-2 stores another sixteen usage-based disturbance bits 508. During a first example read operation, the subset of sense amplifiers 506 pass the sixteen usage-based disturbance bits 508 from the subarray 502-1 of the section 122-1 to the shared circuit 124-1. During a second example read operation, the subset of sense amplifiers 506 pass the sixteen usage-based disturbance bits 508 from the subarray 502-1 of the section 122-2 to the shared circuit 124-1. In this manner, the subset of sense amplifiers 506 can pass usage-based disturbance bits 508 to the shared circuit 124-1 from different sections 122-1 and 122-2 during different time intervals. Example components of the subarrays 502-1 to 502-S are further described with respect to FIG. 6.

Figure 6:
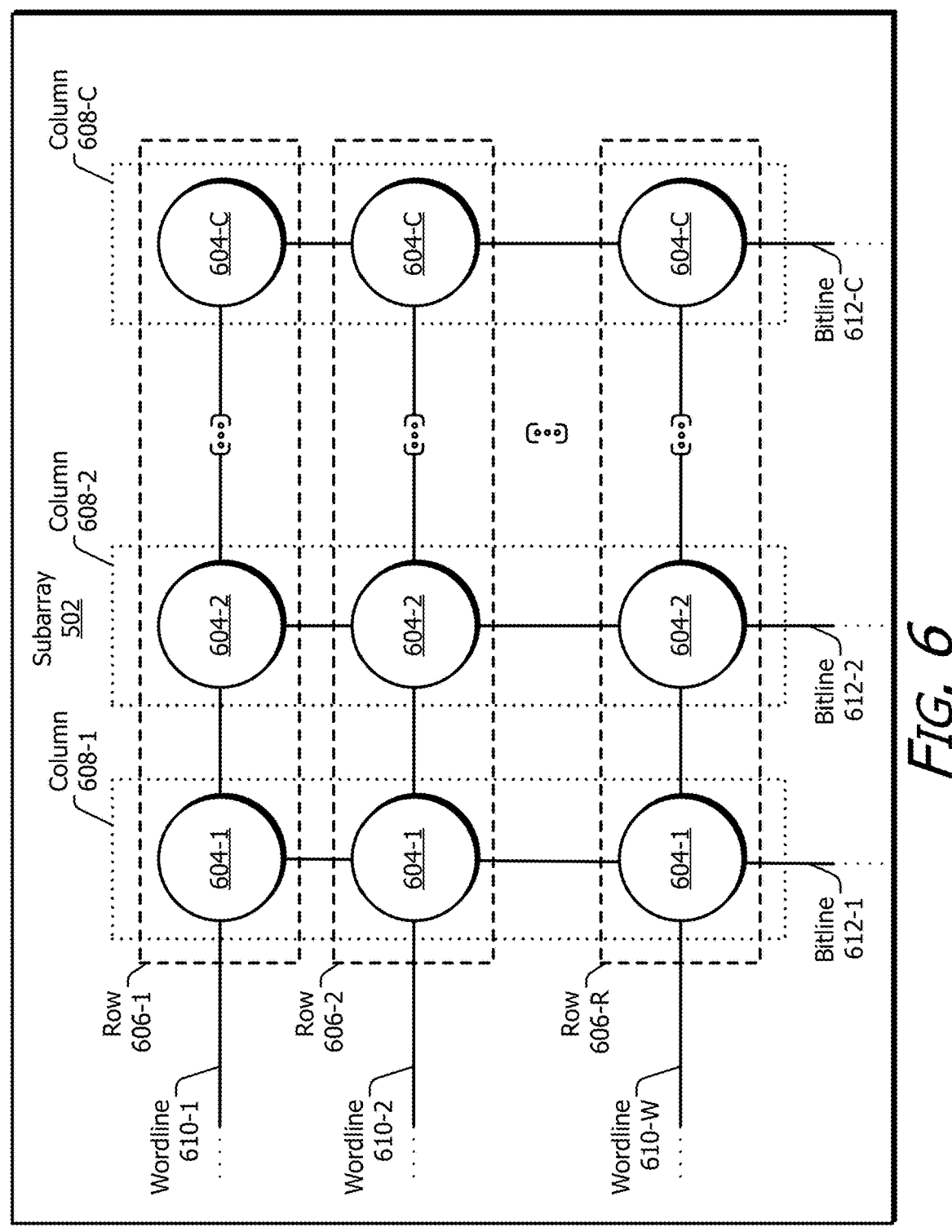
FIG. 6 illustrates an example subarray of a memory device that implements aspects of shareable usage-based disturbance circuitry.

FIG. 6 illustrates an example subarray 502, which can represent any of the subarrays 502-1 to 502-S shown in FIG. 5. A physical layout of the subarray 502 is shown relative to a first axis 602-1 (X axis 602-1) and a second axis 602-2 (Y axis 602-2). The first axis 602-1 represents a "horizontal" axis, and the second axis 602-2 represents a "vertical" axis. The second axis 602-2 is substantially perpendicular to the first axis 602-1.

In the depicted configuration, the subarray 502 includes multiple memory cells 604 arranged in rows 606 and columns 608. In FIG. 6, the subarray 502 is shown to include rows 606-1, 606-2 . . . 606-R and columns 608-1, 608-2 . . . 608-C, with R and C representing positive integers. Each row 606 includes a group of memory cells 604, such as memory cells 604-1, 604-2 . . . 604-C. The memory cells 604 within each row 606 are coupled to a wordline (WL) 610 that is associated with that row 606. For example, the memory cells 604-1 to 604-C of row 606-1 are coupled to wordline 610-1. Also, the memory cells 604-1 to

604-C of row 606-2 are coupled to wordline 610-2. Similarly, the memory cells 604-1 to 604-C of row 606-R are coupled to wordline 610-W.

The memory cells 604 within each column 608 are coupled to a bitline (BL) 612 that is associated with that column 608. For example, the memory cells 604-1 within rows 606-1 to 606-R are coupled to bitline 612-1. Also, the memory cells 604-2 within rows 606-1 to 606-R are coupled to bitline 612-2. Similarly, the memory cells 316-C within rows 606-1 to 606-R are coupled to bitline 312-C. The usage-based disturbance circuitry 120 can be implemented as part of DRAM, as further described with respect to FIG. 7.

Figure 7:
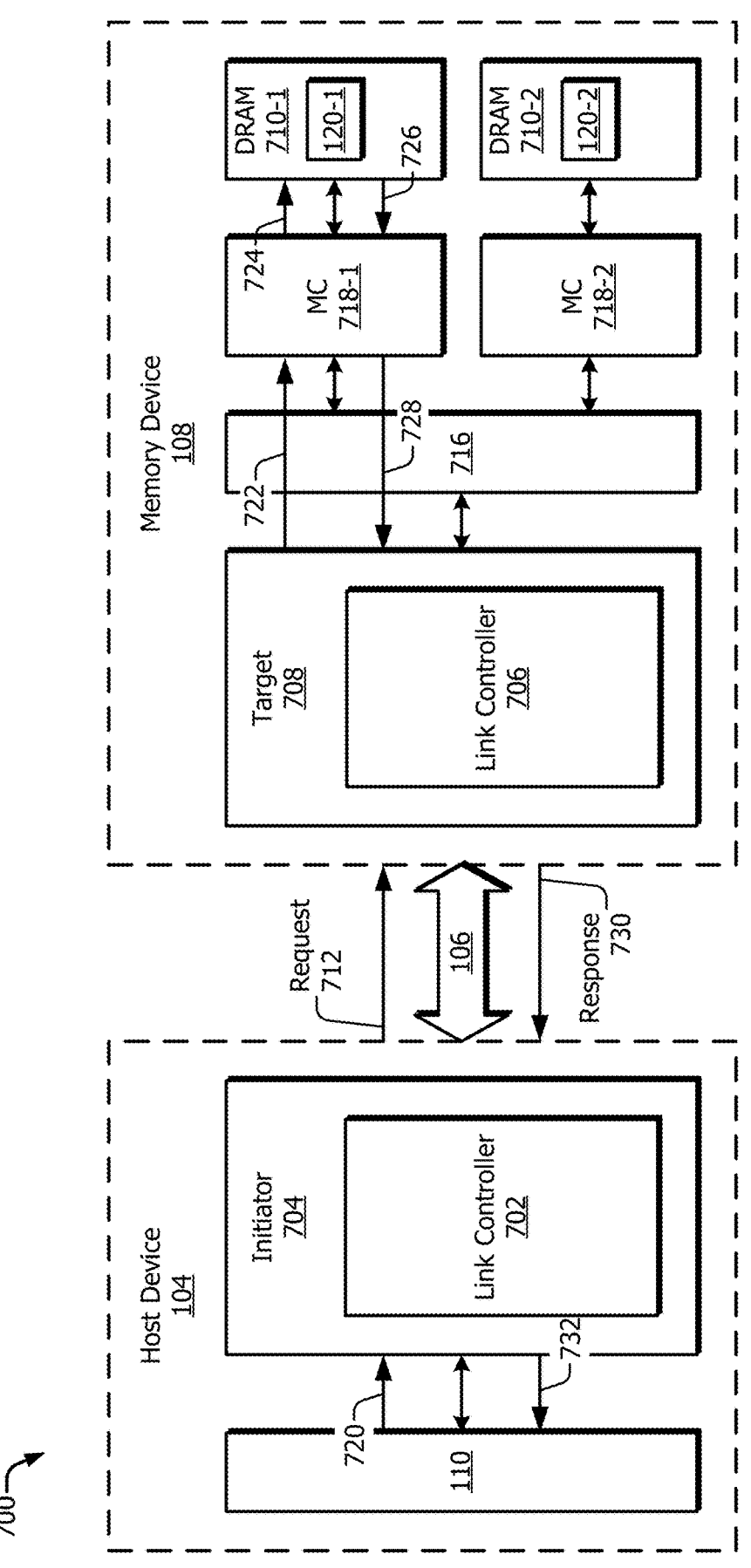
FIG. 7 illustrates an example system that includes a host device and a memory device that is capable of implementing aspects of sharable usage-based disturbance circuitry.

FIG. 7 illustrates an example of a system 700 that includes a host device 104 and a memory device 108 that are coupled together via an interconnect 106. The system 700 may form at least part of an apparatus 102 as shown in FIG. 1. As illustrated, the host device 104 includes a processor 110 and a link controller 702, which can be realized with at least one initiator 704. Thus, the initiator 704 can be coupled to the processor 110 or to the interconnect 106 (including to both), and the initiator 704 can be coupled between the processor 110 and the interconnect 106. Examples of initiators 704 may include a leader, a primary, a master, a main component, and so forth.

In the illustrated example system 700, the memory device 108 includes a link controller 706, which may be realized with at least one target 708. The target 708 can be coupled to the interconnect 106. Thus, the target 708 and the initiator 704 can be coupled to each other via the interconnect 106. Example targets 708 may include a follower, a secondary, a slave, a responding component, and so forth. The memory device 108 also includes a memory, which may be realized with at least one memory module 302 or other component, such as a DRAM 710, as is described further below.

In example implementations, the initiator 704 includes the link controller 702, and the target 708 includes the link controller 706. The link controller 702 or the link controller 706 can instigate, coordinate, cause, or otherwise control signaling across a physical or logical link realized by the interconnect 106 in accordance with one or more protocols. The link controller 702 may be coupled to the interconnect 106. The link controller 706 may also be coupled to the interconnect 106. Thus, the link controller 702 can be coupled to the link controller 706 via the interconnect 106. Each link controller 702 or 706 may, for instance, control communications over the interconnect 106 at a link layer or at one or more other layers of a given protocol. Communication signaling may include, for example, a request 712 (e.g., a write request or a read request), a response 714 (e.g., a write response or a read response), and so forth.

The memory device 108 may further include at least one interconnect 716 and at least one memory controller 718 (e.g., MC 718-1 and MC 718-2). Within the memory device 108, and relative to the target 708, the interconnect 716, the memory controller 718, and/or the DRAM 710 (or other memory component) may be referred to as a "backend" component of the memory device 108. In some cases, the interconnect 716 is internal to the memory device 108 and may operate in a manner the same as or different from the interconnect 106.

As shown, the memory device 108 may include multiple memory controllers 718-1 and 718-2 and/or multiple DRAMs 710-1 and 710-2. Although two each are shown, the memory device 108 may include one or more memory controllers 718 and/or one or more DRAMs 710. For example, a memory device 108 may include four memory controllers 718 and sixteen DRAMs 710, such as four DRAMs 710 per memory controller 718. The memory components of the memory device 108 are depicted as DRAM 710 only as an example, for one or more of the memory components may be implemented as another type of memory. For instance, the memory components may include nonvolatile memory like flash or phase-change memory. Alternatively, the memory components may include other types of volatile memory like static random-access memory (SRAM). A memory device 108 may also include any combination of memory types. In example implementations, the DRAM 710-1 and/or the DRAM 710-2 include usage-based disturbance circuitry 120-1 and 120-2, respectively.

In some cases, the memory device 108 may include the target 708, the interconnect 716, the at least one memory controller 718, and the at least one DRAM 710 within a single housing or other enclosure. The enclosure, however, may be omitted or may be merged with an enclosure for the host device 104, the system 700, or an apparatus 102 (of FIG. 1). The interconnect 716 can be disposed on a printed circuit board. Each of the target 708, the memory controller 718, and the DRAM 710 may be fabricated on at least one integrated circuit and packaged together or separately. The packaged integrated circuits may be secured to or otherwise supported by the printed circuit board and may be directly or indirectly coupled to the interconnect 716. In other cases, the target 708, the interconnect 716, and the one or more memory controllers 718 may be integrated together into one integrated circuit. In some of such cases, this integrated circuit may be coupled to a printed circuit board, and one or more modules for the memory components (e.g., for the DRAM 710) may also be coupled to the same printed circuit board, which can form a CXL type of memory device 108. This memory device 108 may be enclosed within a housing or may include such a housing. The components of the memory device 108 may, however, be fabricated, packaged, combined, and/or housed in other manners.

As illustrated in FIG. 7, the target 708, including the link controller 706 thereof, can be coupled to the interconnect 716. Each memory controller 718 of the multiple memory controllers 718-1 and 718-2 can also be coupled to the interconnect 716. Accordingly, the target 708 and each memory controller 718 of the multiple memory controllers 718-1 and 718-2 can communicate with each other via the interconnect 716. Each memory controller 718 is coupled to at least one DRAM 710. As shown, each respective memory controller 718 of the multiple memory controllers 718-1 and 718-2 is coupled to at least one respective DRAM 710 of the multiple DRAMs 710-1 and 710-2. Each memory controller 718 of the multiple memory controllers 718-1 and 718-2 may, however, be coupled to a respective set of multiple DRAMs 710 (e.g., five DRAMs 710) or other memory components.

Each memory controller 718 can access at least one DRAM 710 by implementing one or more memory access protocols to facilitate reading or writing data based on at least one memory address. The memory controller 718 can increase bandwidth or reduce latency for the memory accessing based on the memory type or organization of the memory components, like the DRAMs 710. The multiple memory controllers 718-1 and 718-2 and the multiple DRAMs 710-1 and 710-2 can be organized in many different manners. For example, each memory controller 718 can realize one or more memory channels for accessing the DRAMs 710. Further, the DRAMs 710 can be manufactured to include one or more ranks, such as a single-rank or a dual-rank memory module. Each DRAM 710 (e.g., at least one DRAM IC chip) may also include multiple banks, such as 8 or 16 banks.

This document now describes examples of the host device 104 accessing the memory device 108. The examples are described in terms of a general access which may include a memory read access (e.g., a retrieval operation) or a memory write access (e.g., a storage operation). The processor 110 can provide a memory access request 720 to the initiator 704. The memory access request 720 may be propagated over a bus or other interconnect that is internal to the host device 104. This memory access request 720 may be or may include a read request or a write request. The initiator 704, such as the link controller 702 thereof, can reformulate the memory access request 720 into a format that is suitable for the interconnect 106. This formulation may be performed based on a physical protocol or a logical protocol (including both) applicable to the interconnect 106. Examples of such protocols are described below:

The initiator 704 can thus prepare a request 712 and transmit the request 712 over the interconnect 106 to the target 708. The target 708 receives the request 712 from the initiator 704 via the interconnect 106. The target 708, including the link controller 706 thereof, can process the request 712 to determine (e.g., extract or decode) the memory access request 720. Based on the determined memory access request 720, the target 708 can forward a memory request 722 over the interconnect 716 to a memory controller 718, which is the first memory controller 718-1 in this example. For other memory accesses, the targeted data may be accessed with the second DRAM 710-2 through the second memory controller 718-2.

The first memory controller 718-1 can prepare a memory command 724 based on the memory request 722. The first memory controller 718-1 can provide the memory command 724 to the first DRAM 710-1 over an interface or interconnect appropriate for the type of DRAM or other memory component. The first DRAM 710-1 receives the memory command 724 from the first memory controller 718-1 and can perform the corresponding memory operation. The memory command 724, and corresponding memory operation, may pertain to a read operation, a write operation, a refresh operation, and so forth. Based on the results of the memory operation, the first DRAM 710-1 can generate a memory response 726. If the memory request 722 is for a read operation, the memory response 726 can include the requested data. If the memory request 722 is for a write operation, the memory response 726 can include an acknowledgment that the write operation was performed successfully. The first DRAM 710-1 can return the memory response 726 to the first memory controller 718-1.

The first memory controller 718-1 receives the memory response 726 from the first DRAM 710-1. Based on the memory response 726, the first memory controller 718-1 can prepare a memory response 728 and transmit the memory response 728 to the target 708 via the interconnect 716. The target 708 receives the memory response 728 from the first memory controller 718-1 via the interconnect 716. Based on this memory response 728, and responsive to the corresponding request 712, the target 708 can formulate a response 730 for the requested memory operation. The response 730 can include read data or a write acknowledgment and be formulated in accordance with one or more protocols of the interconnect 106.

To respond to the request 712 from the host device 104, the target 708 can transmit the response 730 to the initiator 704 over the interconnect 106. Thus, the initiator 704 receives the response 730 from the target 708 via the interconnect 106. The initiator 704 can therefore respond to the "originating" memory access request 720, which is from the processor 110 in this example. To do so, the initiator 704 prepares a memory access response 732 using the information from the response 730 and provides the memory access response 732 to the processor 110. In this way, the host device 104 can obtain memory access services from the memory device 108 using the interconnect 106. Example aspects of an interconnect 106 are described next.

The interconnect 106 can be implemented in a myriad of manners to enable memory-related communications to be exchanged between the initiator 704 and the target 708. Generally, the interconnect 106 can carry memory-related information, such as data or a memory address, between the initiator 704 and the target 708. In some cases, the initiator 704 or the target 708 (including both) can prepare memory-related information for communication across the interconnect 106 by encapsulating such information. The memory-related information can be encapsulated into, for example, at least one packet (e.g., a flit). One or more packets may include headers with information indicating or describing the content of each packet.

In example implementations, the interconnect 106 can support, enforce, or enable memory coherency for a shared memory system, for a cache memory, for combinations thereof, and so forth. Additionally or alternatively, the interconnect 106 can be operated based on a credit allocation system. Possession of a credit can enable an entity, such as the initiator 704, to transmit another memory request 712 to the target 708. The target 708 may return credits to "refill" a credit balance at the initiator 704. A credit-based communication scheme across the interconnect 106 may be implemented by credit logic of the target 708 or by credit logic of the initiator 704 (including by both working together in tandem).

The system 700, the initiator 704 of the host device 104, or the target 708 of the memory device 108 may operate or interface with the interconnect 106 in accordance with one or more physical or logical protocols. For example, the interconnect 106 may be built in accordance with a Peripheral Component Interconnect Express (PCIe or PCI-e) standard. Applicable versions of the PCIe standard may include 1.x, 2.x, 3.x, 7.0, 5.0, 6.0, and future or alternative versions. In some cases, at least one other standard is layered over the physical-oriented PCIe standard. For example, the initiator 704 or the target 708 can communicate over the interconnect 106 in accordance with a Compute Express Link (CXL) standard. Applicable versions of the CXL standard may include 1.x, 2.0, and future or alternative versions. The CXL standard may operate based on credits, such as read credits and write credits. In such implementations, the link controller 702 and the link controller 706 can be CXL controllers. Examples of the usage-based detection circuitry 120 are described herein with reference to at least one memory device 108 (e.g., having a memory array 118, a memory module 302, and/or a DRAM 710). A physical arrangement of the usage-based disturbance circuitry 120 within the die 304 is further described with respect to FIGS. 8 to 11.

Figure 8:
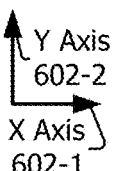
FIG. 8 illustrates an example arrangement of banks and shareable usage-based disturbance circuitry within a die.

FIG. 8 illustrates an example arrangement of groups of banks 402 and shareable usage-based disturbance circuitry 120 within the die 304. In a top-down view 800 shown in FIG. 8, a "top" edge and a "bottom" edge of the die 304 are approximately parallel to the first axis 602-1 (X axis 602-1). Also, a "left" edge and a "right" edge of the die 304 are approximately parallel to the second axis 602-2 (Y axis 602-2).

The die 304 includes groups 802-1 to 802-Z, such as groups 802-1, 802-2 . . . 802-X, 802-(X+1) . . . 802-Y . . . 802-Z, with X, Y, and Z being positive integers. Each group 802 includes one or more banks 402 and the usage-based disturbance circuitry 120. In some cases, the banks 402 within each group 802 are part of a bank group. The usage-based disturbance circuitry 120 within each group 802 is coupled to the one or more banks 402 within that group 802.

In an example implementation, the groups 802-1 to 802-Z are arranged along one dimension of the die 304 to form a line. In some cases, this line is approximately parallel to the first axis 602-1 or the second axis 602-2. In another example implementation, the groups 802-1 to 802-Z are arranged along two or more dimensions of the die 304 to form a grid or array, an example of which is shown in FIG. 8.

In the depicted configuration, at least one group 802 includes two banks 402 (e.g., banks 402-1 and 402-2) and the usage-based disturbance circuitry 120. The usage-based disturbance circuitry 120 can be positioned between the banks 402-1 and 402-2 along the first axis 602-1, as further described with respect to FIG. 11. Other implementations are also possible in which one or more groups 802 include different quantities of banks 402. The physical arrangement of the banks 402 and the usage-based disturbance circuitry 120 within each group 802 is further described with respect to FIGS. 9 to 11.

Figure 9:
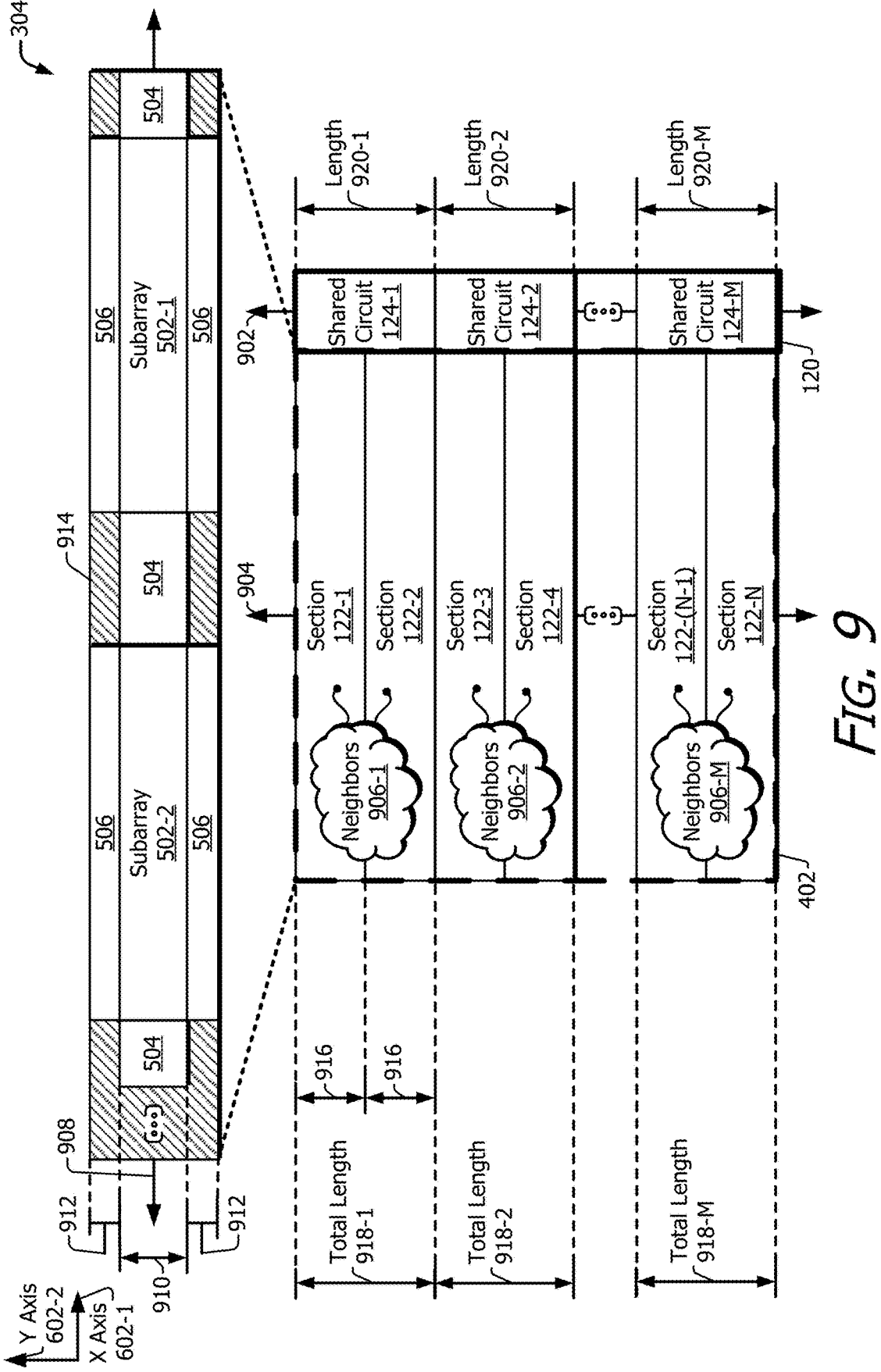
FIG. 9 illustrates an example physical layout of a bank and shareable usage-based disturbance circuitry.

FIG. 9) illustrates an example physical layout of a bank 402 and usage-based disturbance circuitry 120 within a portion of a die 304. The usage-based disturbance circuitry 120 can be positioned proximate to (e.g., next to or adjacent to) the bank 402 along the first axis 602-1. In this manner, the usage-based disturbance circuitry 120 is positioned on one side of the bank 402 in a direction that is parallel to the first axis 602-1. For instance, the usage-based disturbance circuitry 120 can be positioned on a "right" side of the bank 402-1 of FIG. 8 and/or on a "left" side of the bank 402-2 of FIG. 8.

In the depicted configuration, the usage-based disturbance circuitry 120 includes shared circuits 124-1, 124-2 . . . 124-M, which are arranged along an axis 902. The bank 402 includes sections 122-1, 122-2, 122-3, 122-4 . . . 122-(N−1), and 122-N, which are arranged along an axis 904. The axes 902 and 904 are substantially parallel to the second axis 602-2. In general, axes are "substantially parallel" if an angle between the axes is less than a degree (e.g., the angle is less than approximately 1 degree, 0.5 degrees, 0.2 degrees, and so forth). The multiple sections 122-N arranged along the axis 904 can be divided into groups of two, which are positioned proximate to (e.g., next to or adjacent to) each other along the axis 904. The sections 122 within each group can be referred to as neighbors 906 (or neighboring sections). Neighbors 906 represent a consecutive pair of sections 122 within the bank 402. In general, two sections are neighbors 906 if one of the two sections is a next or closest section to the other one of the two sections along a direction that is parallel to the axis 904 (e.g., if a section is closest to a "top" side or a "bottom" side of another section). In this example, the sections 122-1 and 122-2 represent neighbors 906-1, the sections 122-3 and 122-4 represent neighbors 906-2, and the sections 122-(N−1) and 122-N represent neighbors 906-M. As described with respect to FIG. 4, the shared circuit 124-1 is coupled to the sections 122-1 and 122-2. Also, the shared circuit 124-2 is coupled to the sections 122-3 and 122-4. Likewise, the shared circuit 124-M is coupled to the sections 122-(N−1) and 122-N.

An example physical layout of each section 122 is shown at the top of FIG. 9. For simplicity, this section 122 is shown to include subarrays 502-1 and 502-2, wordline drivers 504, and sense amplifiers 506. Although not explicitly shown, the section 122 can include additional subarrays 502, additional wordline drivers 504, and additional sense amplifiers 506.

Within each section 122, the subarrays 502 are positioned along an axis 908, which is substantially parallel to the first axis 602-1. The subarrays 502 have a length 910 defined in a direction that is parallel to the axis 904. The wordline drivers 504 associated with each subarray 502 can be distributed on different sides of the subarray 502. For example, some wordline drivers 504 are distributed on a "left" side and a "right" side of the subarray 502-1. Likewise, some of the wordline drivers 504 are distributed on a "left" side and a "right" side of the subarray 502-2. In some implementations, the wordline drivers 504 positioned between the subarrays 502-1 and 502-2 can be coupled to both of the subarrays 502-1 and 502-2.

The sense amplifiers 506 can also be distributed on different sides of the subarrays 502. For example, a first set of sense amplifiers 506 is positioned proximate to a "top" side of the subarray 502-1, and a second set of sense amplifiers 506 is positioned proximate to a "bottom" side of the subarray 502-1. Likewise, a first set of sense amplifiers 506 is positioned proximate to a "top" side of the subarray 502-2, and a second set of sense amplifiers 506 is positioned proximate to a "bottom" side of the subarray 502-2. In example implementations, the first set of sense amplifiers 506 are coupled to even-numbered bitlines 612 (based on a count starting at 0), and the second set of sense amplifiers 506 are coupled to odd-numbered bitlines 612 (based on a count starting at 0) (or vice versa). In some implementations, the sense amplifiers 506 positioned between subarrays 502 of adjacent sections 122 can be coupled to the two subarrays 502 of the adjacent sections 122, as further described with respect to FIG. 10.

The first set of sense amplifiers 506 and the second set of sense amplifiers 506 can have lengths 912 defined in a direction that is parallel to the axis 904. In general, the lengths illustrated in FIG. 9 are not drawn to scale. In example implementations, the length 912 of each set of sense amplifiers 506 can be approximately 5% of the length 910 of the subarrays 502.

The section 122 is also shown to include region 914, which is represented by a diagonal fill pattern. The region 914 can include other components of the wordline driver 504, the sense amplifier block 506, the section 122, or the bank 402. Additionally or alternatively, the region 914 can include lines of signal routing.

The sections 122 have lengths 916 defined in a direction that is parallel to the axis 904. Each length 916 represents a summation of the length 910 of the subarrays 502 and the lengths 912 of the sets of sense amplifiers 506. Each pair of neighbors 906 has a total length 918, which represents a summation of the lengths 916 of the neighboring sections 122 (e.g., the length of two neighboring sections). For example, the neighbors 906-1 have a total length 918-1, the neighbors 906-2 have a total length 918-2, and the neighbors 906-M have a total length 918-M.

The shared circuits 124-1, 124-2 . . . 124-M have lengths 920-1, 920-2 . . . 920-M, respectively. The lengths 920-1 to 920-M are defined in a direction that is parallel to the axis 902. Each length 920 is less than or equal to a total length 918 of a corresponding group of neighbors 906 (e.g., the length 920 is approximately equal to 100%, 98%, 95%, 90% or 80% of the total length 918). For example, the length 920-1 of the shared circuit 124-1 is less than or equal to the total length 918-1 of the neighbors 906-1. Each length 920 is also greater than or equal to twice the length 910 of the subarrays 502 (e.g., greater than a combined length 910 of the subarrays 502 within the neighbors 906). For example, the length 920-1 of the shared circuit 124-1 is greater than or equal to twice the length 910. Because each shared circuit 124 can mitigate usage-based disturbance within two sections 122, the length 920 of the shared circuit 124 can be longer compared to dedicated circuits in other memory devices that mitigate usage-based disturbance within only one section 122. In some cases, this longer length 920 enables a width of the shared circuits 124, as defined in a direction that is parallel to the first axis 602-1, to be smaller than a width of a dedicated circuit. In some implementations, the width of the shared circuits 124 can be approximately half that of the dedicated circuits (e.g., at least 40%, 45%, or 50% smaller than the width of the dedicated circuit). This reduction in width can reduce a cost of manufacturing the memory device 108 and/or improve array efficiency compared to the other memory device that do not use shareable usage-based disturbance circuitry.

The layout shown in FIG. 9 also avoids complicated signal routing present in some other memory devices that do not employ shareable usage-based disturbance circuitry. These other memory devices, for instance, may have a dedicated circuit that is coupled to sense amplifiers positioned proximate to a "top" edge and a "bottom" edge of the bank 402. This can lead to some complicated routing in order to pass bits to the dedicated circuit. The usage-based disturbance circuitry 120 of FIG. 9, however, can avoid this complex routing as each shared circuit 124 can be positioned next to the corresponding neighbors 906. To further simplify routing and conserve space, the sense amplifiers 506 that are coupled to the shared circuits 124 can be positioned between the subarrays 502 of neighbors 906, as further described with respect to FIG. 10.

Figure 10:
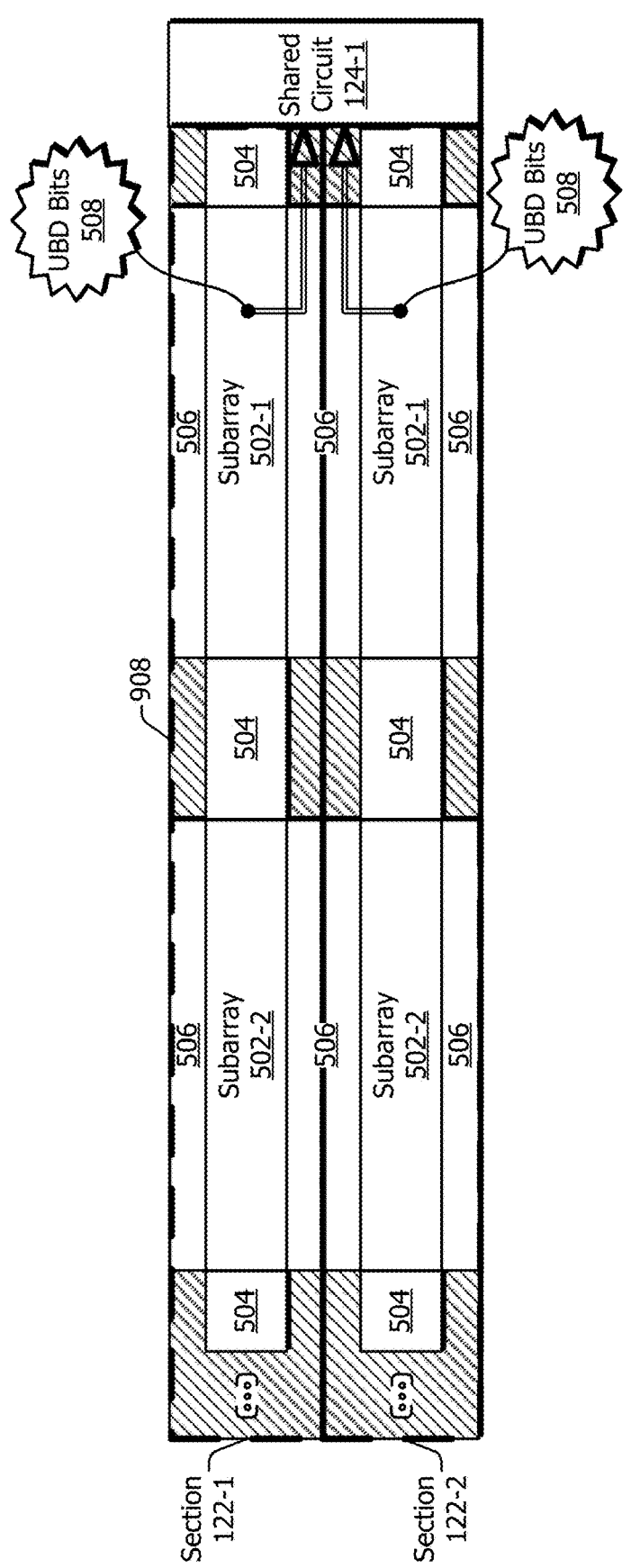
FIG. 10 illustrates example usage-based disturbance bits stored within multiple sections.

FIG. 10 illustrates example usage-based disturbance bits 508 stored within the sections 122-1 and 122-2. In the depicted configuration, at least the subarray 502-1 stores the usage-based disturbance bits 508 associated with the section 122-1, and at least the subarray 502-1 stores the usage-based disturbance bits 508 associated with the section 122-2.

At least a portion of the sense amplifiers 506 positioned between the subarrays 502-1 of the sections 122-1 and 122-2 are coupled to the shared circuit 124-1, as shown by the arrows. This portion of sense amplifiers 506 can sense the usage-based disturbance bits 508 stored by the subarrays 502-1 within the sections 122-1 and 122-2 and enable these bits to be transmitted to the shared circuit 124-1. In particular, during a first time interval, these sense amplifiers 506 can sense the usage-based disturbance bits 508 stored by the subarray 502-1 within the section 122-1. During a second time interval, these sense amplifiers 506 can sense the usage-based disturbance bits 508 stored by the subarray 502-1 within the section 122-2. The sense amplifiers 506 positioned above the subarray 502-1 of the section 122-1 and the sense amplifiers 506 positioned below the subarray 502-1 of the section 122-2 may not be coupled to the shared circuit 124-1. In this manner, routing between the sense amplifiers 506 within the sections 122-1 and 122-2 and the shared circuit 124-1 can be simplified, which can reduce signal routing complexity and cost of the memory device 108.

Figure 11:
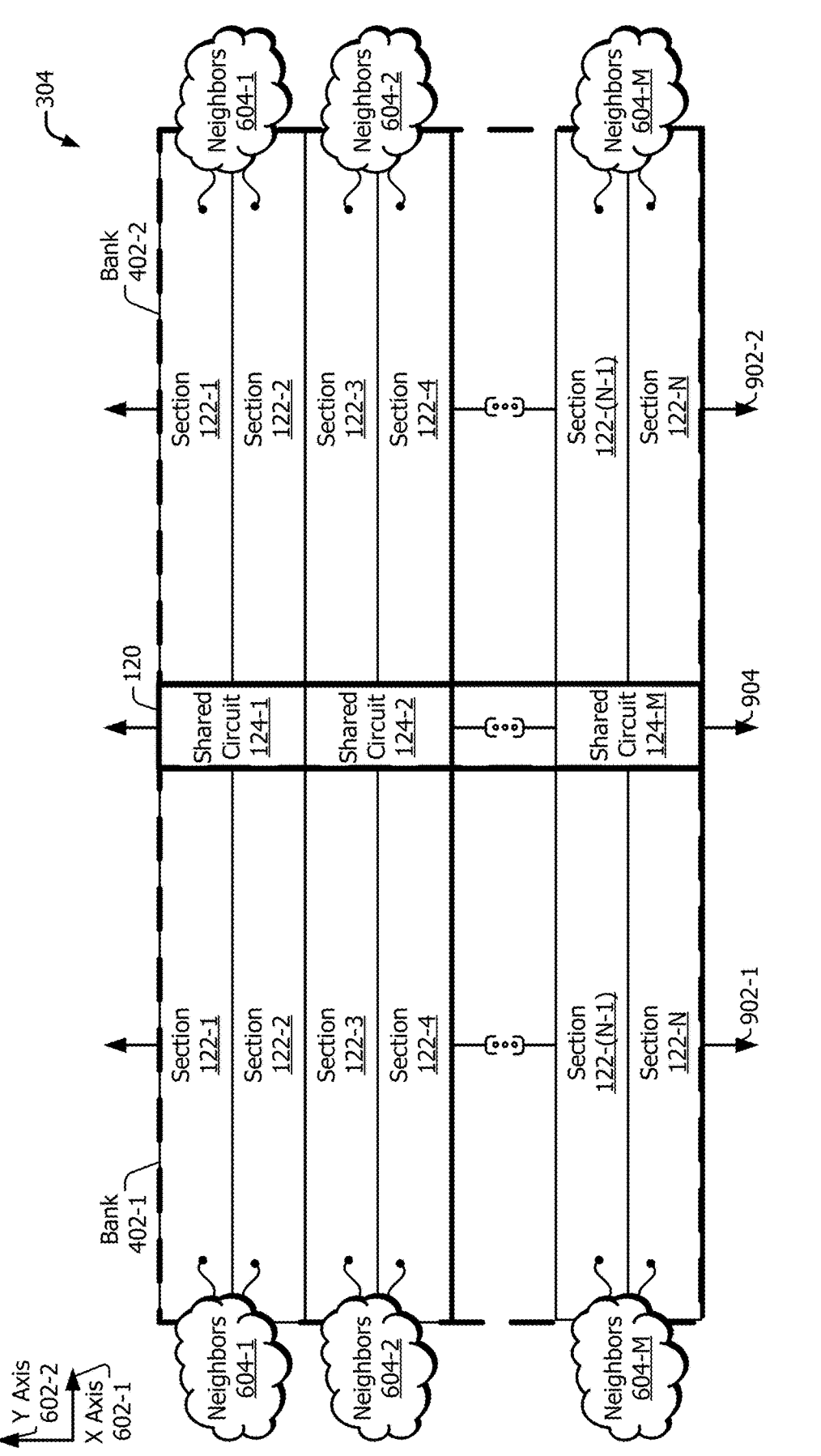
FIG. 11 illustrates an example physical layout of multiple banks and shareable usage-based disturbance circuitry.

FIG. 11 illustrates an example physical layout of multiple neighbors 604 (e.g., neighbors 604-1, 604-2 . . . 604-M) within two banks 402 (e.g., banks 402-1 and 402-2), and an example physical layout of multiple shared circuits 124 (e.g., shared circuits 124-1, 124-2 . . . 124-M) of the usage-based disturbance circuitry 120. The layout of the banks 402-1 and 402-2 can be similar to the layout described with respect to FIGS. 9 and 10. In some cases, the layout of the bank 402-2 represents a mirrored or flipped version of the layout of the bank 402-1.

In the depicted configuration, the sections 122-1 to 122-N within the bank 402-1 are positioned along the axis 902-1. Likewise, the sections 122-1 to 122-N within the bank 402-2 are positioned along the axis 902-2. The shared circuits 124-1 to 124-M of the usage-based disturbance circuitry 120 are positioned along the axis 904. The axes 902-1, 902-2, and 904 are substantially parallel to each other.

The usage-based disturbance circuitry 120 is coupled to the banks 402-1 and 402-2. In particular, the shared circuit 124-1 is coupled to the neighbors 904-1 of banks 402-1 and bank 402-2. For instance, the shared circuit 124-1 is coupled to at least one sense amplifier block 506 within each of the sections 122-1 and 122-2 of each bank 402-1 and 402-2. More specifically, the shared circuit 124-1 is coupled to at least a portion of the sense amplifiers 506 positioned between subarrays 502 of the sections 122-1 and 122-2. Likewise the shared circuit 124-M is coupled to the neighbors 604-M of banks 402-1 and 402-2. For instance, the shared circuit 124-M is coupled to at least one sense amplifier block 506 within each of the sections 122-(N−1) and 122-N of each bank 402-1 and 402-2. More specifically, the shared circuit 124-M is coupled to at least a portion of the sense amplifiers 506 positioned between subarrays 502 of the sections 122-1 and 122-2. In this manner, each shared circuit 124 can manage usage-based disturbance within multiple sections 122 of multiple banks 402.

EXAMPLE METHOD

This section describes example methods for implementing sharable usage-based disturbance circuitry with reference to the flow diagram of FIG. 12. These descriptions may also refer to components, entities, and other aspects depicted in FIGS. 1 to 11 by way of example only. The described methods are not necessarily limited to performance by one entity or multiple entities operating on one device.

FIG. 12 illustrates a flow diagram 1200, which includes operations 1202 through 1204. These operations can be performed to manufacture a die 304 of a memory device 108. At 1202, a bank comprising two sections is disposed on a die. The two sections are positioned along an axis and have a total length defined in a direction that is parallel to the axis.

For example, the manufacturing process disposes the bank 402 on the die 304, as shown in FIG. 4. The bank 308 includes at least two sections 122 (e.g., sections 122-1 and 122-2). The two sections 122 can be neighbors 906 (e.g., neighbors 906-1). The two sections 122 are positioned along the axis 904 and have a total length 918 defined in a direction that is parallel to the axis 904, as shown in FIG. 9.

At 1204, a circuit is disposed on the die. The circuit has a length defined in a direction that is parallel to the axis. The length is less than or equal to the total length. The circuit is positioned proximate to the two sections in a direction that is perpendicular to the axis.

For example, the manufacturing processes disposes at least one shared circuit 124 on the die 304, as shown in FIG. 4. The shared circuit 124 has a length 920 defined in a direction that is parallel to the axis 904, as shown in FIG. 9. The length 920 is less than or equal to the total length 918. The length 920 can also be greater than twice the length 910 of the subarrays 502 within each of the two sections 122. The shared circuit 124 is positioned proximate to the two sections 122 in a direction that is perpendicular to the axis 904.

Aspects of these methods or operations may be implemented in, for example, hardware (e.g., fixed-logic circuitry or a processor in conjunction with a memory), firmware, or some combination thereof. The methods may be realized using one or more of the apparatuses, systems, or components shown in FIGS. 1-8, the components of which may be further divided, combined, rearranged, and so on. The devices, systems, and components of these figures generally represent firmware, such as executable-code or the actions thereof: hardware, such as electronic devices, packaged modules, IC chips, or circuits: software, such as processor-executable instructions: or a combination thereof. The illustrated apparatuses 102 and components of 200, include, for instance, a memory controller 114, an interconnect 106, and a memory device 108. FIGS. 1-8 illustrate some of the many possible systems or apparatuses capable of implementing the described methods.

Computer-readable media includes both non-transitory computer storage media and communication media including any medium that facilitates transfer of a computer program (e.g., an application) or data from one entity to another. Non-transitory computer storage media can be any available medium accessible by a computer, such as RAM, ROM, Flash, EEPROM, optical media, and magnetic media.

Unless context dictates otherwise, use herein of the word "or" may be considered use of an "inclusive or," or a term that permits inclusion or application of one or more items that are linked by the word "or" (e.g., a phrase "A or B" may be interpreted as permitting just "A," as permitting just "B," or as permitting both "A" and "B"). Also, as used herein, a phrase referring to "at least one of" a list of items refers to any combination of those items, including single members. For instance, "at least one of a, b, or c" can cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c, or any other ordering of a, b, and c). Further, items represented in the accompanying figures and terms discussed herein may be indicative of one or more items or terms, and thus reference may be made interchangeably to single or plural forms of the items and terms in this written description.

In the following, various examples for implementing aspect of shareable usage-based disturbance circuitry are described:

Example 1: An apparatus comprising:
a memory device comprising:
at least one bank comprising multiple sections positioned along an axis, the multiple sections comprising two sections positioned proximate to each other along the axis, the two sections having a total length defined in a direction that is parallel to the axis: and
multiple circuits arranged along another axis that is substantially parallel to the axis, each circuit of the multiple circuits comprising at least one of the following: a counter circuit or an error-correction-code circuit, the multiple circuits comprising a circuit coupled to the two sections, the circuit having a length defined in a direction that is parallel to the other axis, the length being less than or equal to the total length.

Example 2: The apparatus of example 1 or any other example, wherein:

the two sections comprise a first section and a second section:

each section of the two sections comprises at least one subarray having a length defined in the direction that is parallel to the axis; and the length of the circuit is greater than a summation of the lengths of the at least one subarray of the first and second sections.

Example 3: The apparatus of example 2 or any other example, wherein:

the at least one block comprises multiple sense amplifiers positioned between the at least one subarray of each section of the two sections: and the multiple sense amplifiers are coupled to the at least one subarray of each section of the two sections and are coupled to the circuit.

Example 4: The apparatus of example 2 or any other example, wherein the at least one subarray comprises multiple memory cells positioned along an additional axis that is substantially perpendicular to the axis and the other axis.

Example 5: The apparatus of example 1 or any other example, wherein the circuit is positioned proximate to the two sections along an additional axis that is substantially perpendicular to the axis and the other axis.

Example 6: The apparatus of example 1 or any other example, wherein the circuit is configured to detect conditions associated with usage-based disturbance within the two sections.

Example 7: The apparatus of example 6 or any other example, wherein:

the two sections are configured to store bits associated with detecting the usage-based disturbance; and the circuit is configured to:

read the bits from a first section of the two sections during a first time interval; and read the bits from a second section of the two sections during a second time interval.

Example 8: The apparatus of example 1 or any other example, wherein each circuit of the multiple circuits comprises a counter circuit and an error-correction-code circuit.

Example 9: The apparatus of example 1 or any other example, wherein:

the at least one bank comprises a first bank and a second bank: and the circuit is coupled to the two sections of the first bank and the two sections of the second bank.

Example 10: The apparatus of example 9 or any other example, wherein:

the first bank, the circuit, and the second bank are arranged along an additional axis that is substantially perpendicular to the axis and the other axis; and the circuit is positioned between the first bank and the second bank along the additional axis.

Example 11: The apparatus of example 1 or any other example, wherein the apparatus comprises a Compute Express Link® (CXL®) device.

Example 12: A method of manufacturing a die of a memory device, the method comprising:

disposing, on the die, a bank comprising two sections positioned along an axis, the two sections having a total length defined in a direction that is parallel to the axis; and disposing, on the die, a circuit having a length defined in a direction that is parallel to the axis, the length being less than or equal to the total length, the circuit being positioned proximate to the two sections in a direction that is perpendicular to the axis.

Example 13: The method of example 12 or any other example, wherein the two sections are adjacent to each other along the axis.

Example 14: The method of example 12 or any other example, wherein:

the bank comprises a first bank:

the method further comprises:

disposing, on the die, a second bank comprising two other sections positioned along the axis, the two other sections having the total length defined in the direction that is parallel to the axis: and the disposing of the circuit comprises positioning the circuit between the first bank and the second bank along another axis that is perpendicular to the axis.

Example 15: The method of example 14 or any other example, wherein:

the two sections comprise a first section and a second section:

each section of the two sections comprises sense amplifiers; and the method further comprises:

coupling the circuit to at least a portion of the sense amplifiers of the first section; and coupling the circuit to at least a portion of the sense amplifiers of the second section.

Example 16: An apparatus comprising:

a memory device comprising:

at least one bank comprising multiple sections positioned along an axis, each section of the multiple sections configured to store bits associated with mitigating usage-based disturbance, the multiple sections comprising a first quantity of sections; and multiple circuits positioned along another axis that is substantially parallel to the axis, each circuit of the multiple circuits positioned proximate to two sections of the multiple sections along an additional axis that is substantially perpendicular to the axis and the other axis, each circuit of the multiple circuits coupled to the two sections and configured to read the bits associated with mitigating usage-based disturbance from the two sections, the multiple circuits comprising a second quantity of circuits that is less than the first quantity of sections.

Example 17: The apparatus of example 16 or any other example, wherein the second quantity of circuits is equal to approximately half the first quantity of sections.

Example 18: The apparatus of example 16 or any other example, wherein each circuit of the multiple circuits comprises at least one of the following:

a counter circuit: or an error-correction-code circuit.

Example 19: The apparatus of example 18 or any other example, wherein each circuit of the multiple circuits comprises at least one counter circuit and at least one error-correction-code circuit.

Example 20: The apparatus of example 16 or any other example, wherein:

the at least one bank comprises a first bank and a second bank:

the multiple circuits are positioned between the first bank and the second bank along the additional axis; and each circuit of the multiple circuits is coupled to the two sections of the first bank and the two sections of the second bank.

CONCLUSION

Although aspects of implementing shareable usage-based disturbance circuitry have been described in language specific to certain features and/or methods, the subject of the appended claims is not necessarily limited to the specific features or methods described. Rather, the specific features and methods are disclosed as a variety of example implementations of implementing shareable usage-based disturbance circuitry.

What is claimed is:

1. An apparatus comprising:

a memory device comprising:

at least two banks comprising memory cells arranged in columns along a direction of a first vertical axis and arranged in rows along a direction of a second horizontal axis that is substantially perpendicular to the first vertical axis, each bank of the at least two banks comprising multiple sections of the memory cells, the multiple sections positioned along the direction of the first vertical axis, the multiple sections comprising two sections positioned proximate to each other along the first vertical axis, the two sections having a total length defined relative to the first vertical axis, each section of the two sections comprising multiple subarrays of the memory cells positioned along the direction of the second horizontal axis; and multiple circuits positioned along the direction of the first vertical axis, each circuit of the multiple circuits comprising at least one of the following: a counter circuit or an error-correction-code circuit, the multiple circuits comprising a circuit coupled to two sections of a first bank of the at least two banks and coupled to two sections of a second bank of the at least two banks, the circuit positioned between the first bank and the second bank along the direction of the second horizontal axis, the circuit having a length defined relative to the first vertical axis, the length being less than or equal to the total length, the circuit and groupings of the two sections of the at least two banks being positioned along the direction of the second horizontal axis such that the length of the circuit overlaps at least a portion of the total length of the two sections along the first vertical axis.

2. The apparatus of claim 1, wherein:

the two sections of each of the at least two banks comprise a first section and a second section;

each subarray of the multiple subarrays has a length defined relative to the first vertical axis; and the length of the circuit is greater than a summation of the lengths of a subarray of the first and second sections.

3. The apparatus of claim 2, wherein:

each bank of the at least two banks comprises multiple sense amplifiers positioned between a subarray of each section of the two sections; and the multiple sense amplifiers are coupled to the subarray of each section of the two sections and are coupled to the circuit.

4. The apparatus of claim 2, wherein each subarray of the multiple subarrays comprises at least one row of the memory cells that are positioned along the direction of the second horizontal axis.

5. The apparatus of claim 1, wherein the circuit is positioned adjacent to the two sections of the at least two banks in the direction of the second horizontal axis.

6. The apparatus of claim 1, wherein the circuit is configured to detect conditions associated with usage-based disturbance within the two sections of the at least two banks.

7. The apparatus of claim 6, wherein:

the two sections of the at least two banks are configured to store bits associated with detecting the usage-based disturbance; and the circuit is configured to:

read the bits from a first section of the two sections of one of the at least two banks during a first time interval; and read the bits from a second section of the two sections of the one of the at least two banks during a second time interval.

8. The apparatus of claim 1, wherein each circuit of the multiple circuits comprises a counter circuit and an error-correction-code circuit.

9. The apparatus of claim 1, wherein:

the multiple sections of each of the at least two banks comprise a first quantity of sections; and the multiple circuits comprise a second quantity of circuits that is less than the first quantity of sections.

10. The apparatus of claim 9, wherein the second quantity of circuits is equal to approximately half the first quantity of sections.

11. The apparatus of claim 1, wherein the apparatus comprises a Compute Express Link® (CXL®) device.

12. A method of manufacturing a die of a memory device, the method comprising:

disposing, on the die, a first bank and a second bank, each bank of the first and second banks comprising memory cells arranged in columns along a direction of a first vertical axis and arranged in rows along a direction of a second horizontal axis that is substantially perpendicular to the first vertical axis, each bank of the first and second banks comprising two sections of the memory cells, the two sections positioned along a first vertical axis, the two sections having a total length defined relative to the first vertical axis, each section of the two sections comprising multiple subarrays of the memory cells positioned along the direction of the second horizontal axis; and disposing, on the die, a circuit having a length defined relative to the first vertical axis, the length being less than or equal to the total length, the circuit coupled to two sections of the first bank and two sections of the second bank, the circuit positioned between the first bank and the second bank along the direction of the second horizontal axis, the circuit and groupings of the two sections of the at least two banks being positioned along the direction of the second horizontal axis such that the length of the circuit overlaps at least a portion of the total length of the two sections along the first vertical axis.

13. The method of claim 12, wherein each subarray of the multiple subarrays comprises at least one row of memory cells that are positioned along the direction of the second horizontal axis.

14. The method of claim 12, wherein:

the two sections of each of the at least two banks comprise a first section and a second section;

each subarray of the multiple subarrays has a length defined relative to the first vertical axis; and the length of the circuit is greater than a summation of the lengths of a subarray of the first and second sections.

15. The method of claim 12, wherein:

the two sections comprise a first section and a second section;

each section of the two sections comprises sense amplifiers; and the method further comprises:

coupling the circuit to at least a portion of the sense amplifiers of the first section; and coupling the circuit to at least a portion of the sense amplifiers of the second section.

16. An apparatus comprising:

a memory device comprising:

at least two banks, each bank of the at least two banks comprising memory cells arranged in columns along a direction of a first vertical axis and arranged in rows along a direction of a second horizontal axis that is substantially perpendicular to the first vertical axis, each bank of the at least two banks comprising multiple sections of the memory cells positioned along the direction of the first vertical axis, each section of the multiple sections configured to store bits associated with mitigating usage-based disturbance, the multiple sections comprising a first quantity of sections, each section of the multiple sections comprising multiple subarrays positioned along the direction of the second horizontal axis; and multiple circuits positioned along the direction of the first vertical axis, each circuit of the multiple circuits coupled to a corresponding adjacent pair of the multiple sections within each of the at least two banks, each circuit positioned between the at least two banks along the direction of the second horizontal axis, each circuit of the multiple circuits and groupings of the corresponding adjacent pairs of the multiple sections of the at least two banks positioned along the direction of the second axis such that a length of each circuit overlaps at least a portion of a total length of the corresponding adjacent pair of the multiple sections along the first vertical axis, each circuit of the multiple circuits coupled to the corresponding adjacent pair of the multiple sections and configured to read the bits associated with mitigating usage-based disturbance from the corresponding adjacent pair of the multiple sections, the multiple circuits comprising a second quantity of circuits that is less than the first quantity of sections.

17. The apparatus of claim 16, wherein the second quantity of circuits is equal to approximately half the first quantity of sections.

18. The apparatus of claim 16, wherein each circuit of the multiple circuits comprises at least one of the following:

a counter circuit; or an error-correction-code circuit.

19. The apparatus of claim 18, wherein each circuit of the multiple circuits comprises at least one counter circuit and at least one error-correction-code circuit.

20. The apparatus of claim 16, wherein each circuit of the multiple circuits is configured to detect conditions associated with usage-based disturbance within the corresponding adjacent pair of the multiple sections within each of the at least two banks.

* * * * *